United States Patent
Das et al.

(10) Patent No.: US 9,812,429 B2
(45) Date of Patent: Nov. 7, 2017

(54) INTERCONNECT STRUCTURES FOR ASSEMBLY OF MULTI-LAYER SEMICONDUCTOR DEVICES

(71) Applicant: Massachusetts Institute of Technology, Cambridge, MA (US)

(72) Inventors: Rabindra N. Das, Lexington, MA (US); Mark A. Gouker, Belmont, MA (US); Pascale Gouker, Lexington, MA (US); Leonard M. Johnson, Carlisle, MA (US); Ryan C. Johnson, Woburn, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 0 days.

(21) Appl. No.: 15/312,063

(22) PCT Filed: Nov. 5, 2015

(86) PCT No.: PCT/US2015/059200
§ 371 (c)(1),
(2) Date: Nov. 17, 2016

(87) PCT Pub. No.: WO2016/118210
PCT Pub. Date: Jul. 28, 2016

(65) Prior Publication Data
US 2017/0092621 A1    Mar. 30, 2017

Related U.S. Application Data

(60) Provisional application No. 62/075,318, filed on Nov. 5, 2014.

(51) Int. Cl.
*H01L 23/498* (2006.01)
*H01L 25/065* (2006.01)
*H01L 23/48* (2006.01)

(52) U.S. Cl.
CPC .... *H01L 25/0657* (2013.01); *H01L 23/49816* (2013.01); *H01L 23/49827* (2013.01);
(Continued)

(58) Field of Classification Search
CPC ......... H01L 23/48; H01L 24/01; H01L 24/02; H01L 24/03; H01L 24/10; H01L 24/11;
(Continued)

(56) References Cited

U.S. PATENT DOCUMENTS 4,316,200 A    2/1982   Ames et al.
4,612,083 A    9/1986   Yasumoto et al.
(Continued)

FOREIGN PATENT DOCUMENTS

WO    WO 2016/025451 A1    2/2016
WO    WO 2016/025478 A1    2/2016
(Continued)

OTHER PUBLICATIONS

PCT International Search Report of the ISA for Appl. No. PCT/US2016/060263 dated Jan. 10, 2017; 3 pages.
(Continued)

*Primary Examiner* — Alexander Oscar Williams
(74) *Attorney, Agent, or Firm* — Daly, Crowley, Mofford & Durkee, LLP

(57) ABSTRACT

A multi-layer semiconductor device includes a first semiconductor structure having first and second opposing surfaces, the second surface of the first semiconductor structure having at least a first semiconductor package pitch. The multi-layer semiconductor device also includes a second semiconductor structure having first and second opposing surfaces, the first surface of the second semiconductor structure having a second semiconductor package pitch. The multi-layer semiconductor device additionally includes a third semiconductor structure having first and second oppos-
(Continued)

ing surfaces, the first surface of the third semiconductor structure having a third semiconductor package pitch which is different from at least the second semiconductor package pitch. The second and third semiconductor structures are provided on a same package level of the multi-layer semiconductor device. A corresponding method for fabricating a multi-layer semiconductor device is also provided.

15 Claims, 16 Drawing Sheets

(52) U.S. Cl.
CPC .. *H01L 23/49838* (2013.01); *H01L 23/49866* (2013.01); *H01L 2225/06513* (2013.01); *H01L 2225/06541* (2013.01); *H01L 2225/06555* (2013.01)

(58) Field of Classification Search
CPC . H01L 25/0657; H01L 25/065; H01L 23/498; H01L 23/49816; H01L 23/49827; H01L 23/49838; H01L 23/49866; H01L 2225/06513; H01L 2225/06541; H01L 2225/06555
USPC ....... 257/777, 723, 738, 737, 734, 778, 621, 257/622, 686, 779, 786
See application file for complete search history.

(56) References Cited

U.S. PATENT DOCUMENTS

| | | | |
|---|---|---|---|
| 5,057,877 A | 10/1991 | Briley et al. | |
| 5,156,997 A | 10/1992 | Kumar et al. | |
| 5,371,328 A | 12/1994 | Gutierrez et al. | |
| 5,773,875 A | 6/1998 | Chan | |
| 6,108,214 A | 8/2000 | Fuse | |
| 6,297,551 B1 | 10/2001 | Dudderar et al. | |
| 6,324,755 B1 | 12/2001 | Borkowski et al. | |
| 6,355,501 B1 | 3/2002 | Fung et al. | |
| 6,396,371 B2 | 5/2002 | Streeter et al. | |
| 6,436,740 B1 | 8/2002 | Jen et al. | |
| 6,485,565 B1 | 11/2002 | Springer | |
| 6,819,000 B2 | 11/2004 | Magerlein et al. | |
| 6,825,534 B2 | 11/2004 | Chen et al. | |
| 6,838,774 B2 | 1/2005 | Patti | |
| 7,427,803 B2 | 9/2008 | Chao et al. | |
| 7,589,390 B2 | 9/2009 | Yao | |
| 7,624,088 B2 | 11/2009 | Johnson et al. | |
| 7,932,515 B2 | 4/2011 | Bunyk | |
| 7,939,926 B2 | 5/2011 | Kaskoun et al. | |
| 8,202,785 B2 | 6/2012 | Castex et al. | |
| 8,354,746 B2 | 1/2013 | Huang et al. | |
| 8,466,036 B2 | 6/2013 | Brindle et al. | |
| 8,487,444 B2 | 7/2013 | Law et al. | |
| 8,492,911 B2 | 7/2013 | Bachman et al. | |
| 8,519,543 B1 | 8/2013 | Song et al. | |
| 8,546,188 B2 | 10/2013 | Liu et al. | |
| 8,564,955 B2 | 10/2013 | Schmidt et al. | |
| 8,736,068 B2 | 5/2014 | Bartley et al. | |
| 8,754,321 B2 | 6/2014 | Schroeder et al. | |
| 8,828,860 B2 * | 9/2014 | Gruber ................ | H01L 21/4853 438/612 |
| 8,928,128 B2 | 1/2015 | Karikalan et al. | |
| 8,954,125 B2 | 2/2015 | Corcoles Gonzalez et al. | |
| 9,076,658 B1 | 7/2015 | Brown et al. | |
| 9,171,792 B2 * | 10/2015 | Sun ........................ | H01L 25/16 |
| 2001/0016383 A1 | 8/2001 | Chen et al. | |
| 2002/0094661 A1 | 7/2002 | Enquist et al. | |
| 2003/0067073 A1 | 4/2003 | Akram et al. | |
| 2004/0124538 A1 | 7/2004 | Reif et al. | |
| 2004/0188845 A1 | 9/2004 | Iguchi et al. | |
| 2007/0087544 A1 | 4/2007 | Chang et al. | |
| 2007/0207592 A1 | 9/2007 | Lu et al. | |
| 2008/0093747 A1 | 4/2008 | Enquist et al. | |
| 2008/0122115 A1 | 5/2008 | Popa et al. | |
| 2008/0169559 A1 | 7/2008 | Yang | |
| 2008/0230916 A1 | 9/2008 | Saito et al. | |
| 2008/0290790 A1 | 11/2008 | Jin | |
| 2009/0078966 A1 | 3/2009 | Asai et al. | |
| 2009/0173936 A1 | 7/2009 | Bunyk | |
| 2009/0186446 A1 | 7/2009 | Kwon et al. | |
| 2009/0233436 A1 | 9/2009 | Kim et al. | |
| 2010/0001399 A1 | 1/2010 | Topacio | |
| 2010/0130016 A1 | 5/2010 | DeVilliers | |
| 2010/0148371 A1 | 6/2010 | Kaskoun et al. | |
| 2010/0171093 A1 | 7/2010 | Kabir | |
| 2011/0049675 A1 | 3/2011 | Nagai et al. | |
| 2011/0140271 A1 | 6/2011 | Daubenspeck et al. | |
| 2011/0189820 A1 | 8/2011 | Sasaki et al. | |
| 2011/0204505 A1 | 8/2011 | Pagaila et al. | |
| 2011/0237069 A1 | 9/2011 | Miyazaki | |
| 2011/0248396 A1 | 10/2011 | Liu et al. | |
| 2012/0074585 A1 | 3/2012 | Koo et al. | |
| 2012/0217642 A1 | 8/2012 | Sun et al. | |
| 2012/0228011 A1 | 9/2012 | Chang et al. | |
| 2012/0231621 A1 | 9/2012 | Chang et al. | |
| 2012/0252189 A1 | 10/2012 | Sadaka et al. | |
| 2012/0292602 A1 | 11/2012 | Guo et al. | |
| 2013/0029848 A1 | 1/2013 | Gonzalez et al. | |
| 2013/0093104 A1 | 4/2013 | Wu et al. | |
| 2013/0099235 A1 | 4/2013 | Han | |
| 2013/0147036 A1 | 6/2013 | Choi et al. | |
| 2013/0153888 A1 | 6/2013 | Inoue et al. | |
| 2013/0187265 A1 | 7/2013 | Shih et al. | |
| 2013/0244417 A1 | 9/2013 | Markunas et al. | |
| 2014/0001604 A1 | 1/2014 | Sadaka | |
| 2014/0065771 A1 | 3/2014 | Gruber et al. | |
| 2014/0113828 A1 | 4/2014 | Gilbert et al. | |
| 2014/0246763 A1 | 9/2014 | Bunyk | |
| 2014/0264890 A1 | 9/2014 | Breuer et al. | |
| 2015/0041977 A1 | 2/2015 | Daubenspeck et al. | |
| 2015/0054151 A1 | 2/2015 | Choi et al. | |
| 2015/0054167 A1 | 2/2015 | Pendse | |
| 2015/0054175 A1 | 2/2015 | Meinhold et al. | |

FOREIGN PATENT DOCUMENTS

| | | | |
|---|---|---|---|
| WO | WO 2016/073049 A1 | 5/2016 | |
| WO | WO 2016/118209 A2 | 7/2016 | |
| WO | WO 2016/118210 A2 | 7/2016 | |
| WO | WO 2017/015432 | 1/2017 | |

OTHER PUBLICATIONS

PCT Written Opinion of the ISA for Appl. No. PCT/US2016/060263 dated Jan. 10, 2017; 6 pages.
Ohya, et al.; "Room Temperature Deposition of Sputtered TiN Films for Superconducting Coplanar Waveguide Resonators;" IOP Publishing—Superconductor Science and Technology; vol. 27; Mar. 26, 2014; 10 pages.
Tamiowy, et al.; "The Effect of Thermal Treatment on the Structure, Optical and Electrical Properties of Amorphous Titanium Nitride Thin Films;" Thin Solid Films 311; 1997; 8 pages.
PCT Search Report of the ISA for PCT/US2016/052824 dated Feb. 3, 2017; 6 pages.
PCT Written Opinion of the ISA for PCT/US2016/052824 dated Feb. 3, 2017; 6 pages.
PCT Search Report of the ISA for PCT/US2016/043266 dated Dec. 5, 2016; 5 pages.
PCT Written Opinion of the ISA for PCT/US2016/043266 dated Dec. 5, 2016; 9 pages.
Office Action dated Mar. 3, 2017 for U.S. Appl. No. 14/694,540; dated 16 pages.
International Preliminary Report Dated Feb. 23, 2017 for PCT Application No. PCT/US2015/044608; 9 pages.
International Preliminary Report Dated Feb. 23, 2017 for PCT Application No. PCT/US2015/044679; 9 pages.
International Preliminary Report Dated Feb. 23, 2017 for PCT Application No. PCT/US2015/044651; 10 pages.

(56) References Cited

OTHER PUBLICATIONS

Office Action dated Mar. 24, 2017 for U.S. Appl. No. 15/303,800; 39 pages.
PCT Search Report of the ISA for PCT/US2016/060296 dated Mar. 10, 2017; 5 pages.
PCT Written Opinion of the ISA PCT/US2016/060296 dated Mar. 10, 2017; 5 pages.
PCT Search Report of the ISA for PCT/US2016/060309 dated Mar. 24, 2017; 6 pages.
PCT Written Opinion of the ISA for PCT/US2016/060309 dated Mar. 24, 2017; 10 pages.
Restriction Requirement dated Apr. 28, 2017 for U.S. Appl. No. 15/342,444; 9 pages.
Response to Restriction Requirement and Preliminary Amendment dated Apr. 28, 2017 for U.S. Appl. No. 15/342,444 filed May 19, 2017; 6 pages.
Restriction Requirement dated May 16, 2017 for U.S. Appl. No. 15/327,249; 6 pages.
PCT International Preliminary Report on Patentability dated May 18, 2017 for PCT Appl. No. PCT/US2015/059181; 11 pages.
PCT International Preliminary Report on Patentability dated May 18, 2017 for PCT Appl. No. PCT/US2015/059200; 11 pages.
U.S. Appl. No. 15/303,800, dated Oct. 13, 2016, Das, et al.
U.S. Appl. No. 14/694,540, dated Apr. 23, 2015, Das, et al.
U.S. Appl. No. 15/271,755, dated Sep. 21, 2016, Das.
U.S. Appl. No. 15/342,478, dated Nov. 3, 2016, Oliver, et al.
U.S. Appl. No. 15/342,589, dated Nov. 3, 2016, Oliver, et al.
U.S. Appl. No. 15/342,444, dated Nov. 3, 2016, Oliver, et al.
U.S. Appl. No. 15/342,517, dated Nov. 3, 2016, Oliver, et al.
PCT Search Report of the ISA for PCT Appl. No. PCT/US2015/059181 dated Sep. 7, 2016; 5 pages.
PCT Written Opinion of the ISA for PCT Appl. No. PCT/US2015/059181 dated Sep. 7, 2016; 12 pages.
PCT Search Report of the ISA for PCT Appl. No. PCT/US2015/059200 dated Jul. 21, 2016; 3 pages.
PCT Written Opinion of the ISA for PCT Appl. No. PCT/US2015/059200 dated Jul. 21, 2016; 13 pages.
PCT Search Report of the ISA for PCT Appl. No. PCT/US2015/044608 dated Dec. 31, 2015; 5 pages.
PCT Written Opinion of the ISA for PCT Appl. No. PCT/US2015/044608 dated Dec. 31, 2015; 7 pages.
PCT Search Report of the ISA for PCT Appl. No. PCT/US2015/044679 dated Apr. 13, 2016; 3 pages.
PCT Written Opinion of the ISA for PCT Appl. No. PCT/US2015/044679 dated Apr. 13, 2016; 7 pages.
PCT Search Report of the ISA for PCT Appl. No. PCT/US2015/044651 dated Nov. 4, 2015; 3 pages.
PCT Search Report of the ISA for PCT Appl. No. PCT/US2015/044651 dated Nov. 4, 2015; 12 pages.
Burns, et al.: "3D Circuit Integration Technology for Multiproject Fabrication;" MIT Lincoln Laboratory Presentation; Apr. 7, 2000; 15 pages.
Courtland; "Google Aime for Quantum Computing Supremacy;" Spectrum.IEEE.Org; North America; Jun. 2017; 2 pages.
International Search Report of the ISA for PCT Appl. No. PCT/US2016/060343 dated Jul. 18, 2017; 3 pages.
International Written Opinion of the ISA for PCT Appl. No. PCT/US2016/060343 dated Jul. 18, 2017; 12 pages.
Notice of Allowance for U.S. Appl. No. 15/327,235 dated Jun. 30, 2017; 17 pages.
Notice of Allowance for U.S. Appl. No. 14/694,540 dated Jul. 31, 2017; 9 pages.
Office Action dated Jul. 7, 2017 for U.S. Appl. No. 15/271,755; 26 pages.
Response to Office Action dated Mar. 3, 2017 for U.S. Appl. No. 14/694,540, filed Jun. 1, 2017; 24 pages.
Response to Office Action dated Mar. 24, 2017 for U.S. Appl. No. 15/303,800, filed Jun. 26, 2017; 22 pages.
Response to Restriction Requirement dated May 16, 2017 for U.S. Appl. No. 15/327,249, filed Jun. 27, 2017; 1 page.
Response to Restriction Requirement dated Jun. 8, 2017 for U.S. Appl. No. 15/271,755, filed Jun. 19, 2017; 1 page.
Office Action dated Aug. 11, 2017 for U.S. Appl. No. 15/342,444; 22 pages.

\* cited by examiner

INTERCONNECT STRUCTURES FOR ASSEMBLY OF MULTI-LAYER SEMICONDUCTOR DEVICES

CROSS REFERENCE TO RELATED APPLICATIONS

This application is a U.S. National Stage of PCT application PCT/US2015/059200 filed in the English language on Nov. 5, 2015, and entitled "INTERCONNECT STRUCTURES FOR ASSEMBLY OF MULTI-LAYER SEMICONDUCTOR DEVICES," which claims the benefit under 35 U.S.C. §119 of provisional application No. 62/075,318 filed Nov. 5, 2014, which application is hereby incorporated herein by reference.

STATEMENT REGARDING FEDERALLY SPONSORED RESEARCH

This invention was made with government support under Contract No. FA8721-05-C-0002 awarded by the U.S. Air Force. The government has certain rights in the invention.

FIELD

This disclosure relates generally to multi-layer semiconductor devices, and more particularly, to interconnect structures for assembly of multi-layer semiconductor devices.

BACKGROUND

As is known in the art, there is trend toward miniaturization of electronic products such as mobile phones, tablets, digital cameras, and the like. Consequently, there has been a trend in semiconductor device manufacturing towards smaller and more densely packed semiconductor structures and sections. This has resulted in a demand for semiconductor packages which are relatively low loss, lightweight structures and which support increased electronic capabilities (e.g., increased density, mobility and extended operational life) in miniaturized electronic products demanded by both military and commercial customers alike.

The foregoing trend and demand, drives a need for multi-layer semiconductor devices, semiconductor devices including at least two semiconductor structures. The foregoing trend and demand also drives a need for interconnect structures which enable assembly of multi-layer semiconductor devices.

SUMMARY

Described herein are concepts, systems, circuits and techniques related to multi-layer semiconductor devices and interconnect structures for assembly of multi-layer semiconductor devices. The described systems and techniques can, for example, be used to provide multi-layer semiconductor devices which include semiconductor structures of various sizes, shapes, and semiconductor package pitches on a same package level of the multi-layer semiconductor devices.

In one aspect of the concepts described herein, a multi-layer semiconductor device includes a first semiconductor structure having first and second opposing surfaces, the second surface of the first semiconductor structure having at least a first semiconductor package pitch. The multi-layer semiconductor device also includes a second semiconductor structure having first and second opposing surfaces, the first surface of the second semiconductor structure having a second semiconductor package pitch. The multi-layer semiconductor device additionally includes a third semiconductor structure having first and second opposing surfaces, the first surface of the third semiconductor structure having a third semiconductor package pitch which is different from at least the second semiconductor package pitch.

The multi-layer semiconductor device further includes one or more first interconnect structures disposed between and coupled to first select portions of the first surface of the second semiconductor structure and to first select portions of the second surface of the first semiconductor structure. The first interconnect structures form an interconnect for electrically and mechanically coupling the second semiconductor structure to the first semiconductor structure. Each of the first interconnect structures has first and second opposing portions. A distance between the first and second portions is selected based upon at least one of the first semiconductor package pitch and the second semiconductor package pitch.

The multi-layer semiconductor device additionally includes one or more second interconnect structures disposed between and coupled to first select portions of the first surface of the third semiconductor structure and to second select portions of the second surface of the first semiconductor structure. The second interconnect structures form an interconnect for electrically and mechanically coupling the third semiconductor structure to the first semiconductor structure. Each of the second interconnect structures has first and second opposing portions. A distance between the first and second portions is selected based upon at least one of the first semiconductor package pitch and the third semiconductor package pitch. The first and second interconnect structures are selected such that second semiconductor structure is provided on a same package level of the multi-layer semiconductor device as the third semiconductor structure.

The multi-layer semiconductor device may include one or more of the following features individually or in combination with other features. The first semiconductor structure is an interposer module or a multi-chip module (MCM). At least one of the first interconnect structures includes a first interconnect structure portion coupled to the second surface of first semiconductor structure. The first interconnect structure portion includes a first interconnect pad having first and second opposing surfaces, the first surface of the first interconnect pad corresponding to the first portion of the at least one of the first interconnect structures. The first interconnect structure portion also includes a first conductive structure having first and second opposing portions. The first portion of first conductive structure is disposed over and coupled to the second surface of the first interconnect pad. Additionally, the second portion of first conductive structure has a cavity formed in select parts of the second portion.

At least one of the first interconnect structures includes a second interconnect structure portion coupled to the first surface of second semiconductor structure. The second interconnect structure portion includes a second interconnect pad having first and second opposing surfaces, the first surface of the first interconnect pad corresponding to the second portion of the at least one of the first interconnect structures. The second interconnect structure portion also includes a second conductive structure having first and second opposing portions, the first portion disposed over and coupled to the second surface of the second interconnect pad.

The cavity in the second portion of the first conductive structure has a predetermined shape and extends a predetermined distance between the second portion of the first conductive structure and the first portion of the first conductive structure. The predetermined shape is selected such that the cavity is shaped to receive at least a select part of the second portion of the second conductive structure during coupling. Dimensions of one or more of the first interconnect pad, the first conductive structure, the cavity, the second interconnect pad and the second conductive structure are selected based upon at least one of the first semiconductor package pitch and the second semiconductor package pitch. At least one of the second portion of the second conductive structure and the cavity is coated with a fusible conductive material. The first conductive structure is provided from a material or combination of materials having a first melt temperature, and the second conductive structure is provided from a material or combination of materials having a second, different melt temperature. The second conductive structure is provided as a solder ball, sphere, pillar, or micro-bump.

At least one of the second interconnect structures includes a first interconnect pad coupled to the second surface of the first semiconductor structure or to the first surface of the third semiconductor structure. The first interconnect pad has first and second opposing surfaces, the first surface corresponding to the first portion of the at least one of the second interconnect structures. At least one of the second interconnect structures includes a first conductive structure having first and second opposing portions and one or more edges spaced between the first and second portions. The first portion is disposed over and coupled to first select portions of the second surface of the first interconnect pad, and the second portion corresponds to the second portion of the at least one of the second interconnect structures. At least one of the second interconnect structures includes a first barrier structure having first and second opposing surfaces and one or more sides. The first surface of the first barrier structure is disposed over and coupled to second select portions of the second surface of the interconnect pad, and surrounds corresponding edges of the first conductive structure.

The second portion of the first conductive structure extends a predetermined distance above the second surface of the first interconnect connect pad. The predetermined distance is selected based upon at least one of the first semiconductor package pitch and the third semiconductor package pitch. The first conductive structure is provided from a material having a first surface energy and the first barrier structure is provided from a material having a second, lower surface energy.

At least one of the first interconnect structures includes a first interconnect structure portion coupled to the second surface of first semiconductor structure. The first interconnect structure portion includes a first interconnect pad having first and second opposing surfaces, the first surface of the first interconnect pad corresponding to the first portion of the at least one of the first interconnect structures. The first interconnect structure portion also includes a first conductive structure having first and second opposing surfaces and one or more sides. The first surface of the first conductive structure is disposed over and coupled to the second surface of the first interconnect pad, and the second surface and select ones of the sides coated with a first fusible conductive material having a first melt temperature.

At least one of the first interconnect structures includes a second interconnect structure portion coupled to the first surface of second semiconductor structure. The second interconnect structure portion includes a second interconnect pad having first and second opposing surfaces, the first surface of the first interconnect pad corresponding to the second portion of the at least one of the first interconnect structures. The second interconnect structure portion also includes a second conductive structure having first and second opposing surfaces and one or more sides, the first surface disposed over and coupled to the second surface of the second interconnect pad. The second surface and select ones of the sides of the second conductive structure are coated with a second fusible conductive material having a second, different melt temperature.

The multi-layer semiconductor device includes an under bump metallization (UBM) layer or structure disposed between a first surface of a second conductive structure and a second surface of a second interconnect pad. The UBM layer or structure is provided from a third fusible conductive material having a third, different melt temperature. The first interconnect structures include at least one interconnect structure provided as an Indium (In) micro-bump. The first interconnect structures also include at least one interconnect structure provided as a Gold (Au) micro-bump. The second semiconductor structure is coupled to the first semiconductor structure using a flip-chip bonding process. The at least one interconnect structure provided as a Gold (Au) micro-bump controls the distance between the first and second portions of the at least one interconnect structure provided as an Indium (In) micro-bump during the flip-chip bonding process.

The multi-layer semiconductor device includes a fourth semiconductor structure having first and second opposing surfaces. The first surface of fourth semiconductor structure has a fourth semiconductor package pitch which is different from at least one of the second semiconductor package pitch and the third semiconductor package pitch. The multi-layer semiconductor device includes one or more third interconnect structures disposed between and coupled to first select portions of the first surface of the third semiconductor structure and to third select portions of the second surface of the first semiconductor structure. The third interconnect structures form an interconnect for electrically and mechanically coupling the fourth semiconductor structure to the first semiconductor structure. Each of the third interconnect structures has first and second opposing portions. A distance between the first and second portions is selected based upon at least one of the first semiconductor package pitch and the fourth semiconductor package pitch. The third interconnect structures are selected such that fourth semiconductor structure is provided on a same package level of the multi-layer semiconductor device as each of the second and third semiconductor structures.

In another aspect of the concepts described herein, a method for fabricating a multi-layer semiconductor device includes providing a first semiconductor structure having first and second opposing surfaces, the second surface of the first semiconductor structure having at least a first semiconductor package pitch. The method also includes providing a second semiconductor structure having first and second opposing surfaces, the first surface of second semiconductor structure having a second semiconductor package pitch. The method additionally includes providing a third semiconductor structure having first and second opposing surfaces, the first surface of third semiconductor structure having a third semiconductor package pitch which is different from at least the second semiconductor package pitch.

The method further includes providing one or more first interconnect structures. Each of the first interconnect structures has first and second opposing portions. A distance between the first and second portions is selected based upon at least one of the first semiconductor package pitch and the second semiconductor package pitch. The method also includes disposing the first portions of the first interconnect structures over first select portions of the second surface of the first semiconductor structure. The method additionally includes coupling first select portions of the first surface of the second semiconductor structure to the second portions of the first interconnect structures to form an interconnect for electrically and mechanically coupling the second semiconductor structure to the first semiconductor structure. The interconnect is provided on a first package level of the multi-layer semiconductor device.

The method also includes providing one or more second interconnect structures. Each of the second interconnect structures having first and second opposing portions. A distance between the first and second portions is selected based upon at least one of the first semiconductor package pitch and the third semiconductor package pitch. The method additionally includes disposing the first portions of the first interconnect structures over second select portions of the second surface of the first semiconductor structure. The method further includes coupling first select portions of the first surface of the third semiconductor structure to the second portions of the third interconnect structures to form an interconnect for electrically and mechanically coupling the third semiconductor structure to the first semiconductor structure. The interconnect is provided on the first package level of the multi-layer semiconductor device.

The method may include one or more of the following features either individually or in combination with other features. Providing a fourth semiconductor structure having first and second opposing surfaces. The first surface of fourth semiconductor structure has a fourth semiconductor package pitch which is different from at least one of the second semiconductor package pitch and the third semiconductor package pitch. Providing one or more third interconnect structures. Each of the third interconnect structures having first and second opposing portions. A distance between the first and second portions is selected based upon at least one of the first semiconductor package pitch and the fourth semiconductor package pitch. Disposing the first portions of the first interconnect structures over third select portions of the second surface of the first semiconductor structure. Coupling first select portions of the first surface of the fourth semiconductor structure to the second portions of the third interconnect structures to form an interconnect for electrically and mechanically coupling the fourth semiconductor structure to the first semiconductor structure. The interconnect is provided on the first package level of the multi-layer semiconductor device.

BRIEF DESCRIPTION OF THE DRAWINGS

Features and advantages of the concepts, systems, circuits and techniques disclosed herein will be apparent from the following description of the embodiments taken in conjunction with the accompanying drawings in which.

DETAILED DESCRIPTION

Figure 1:
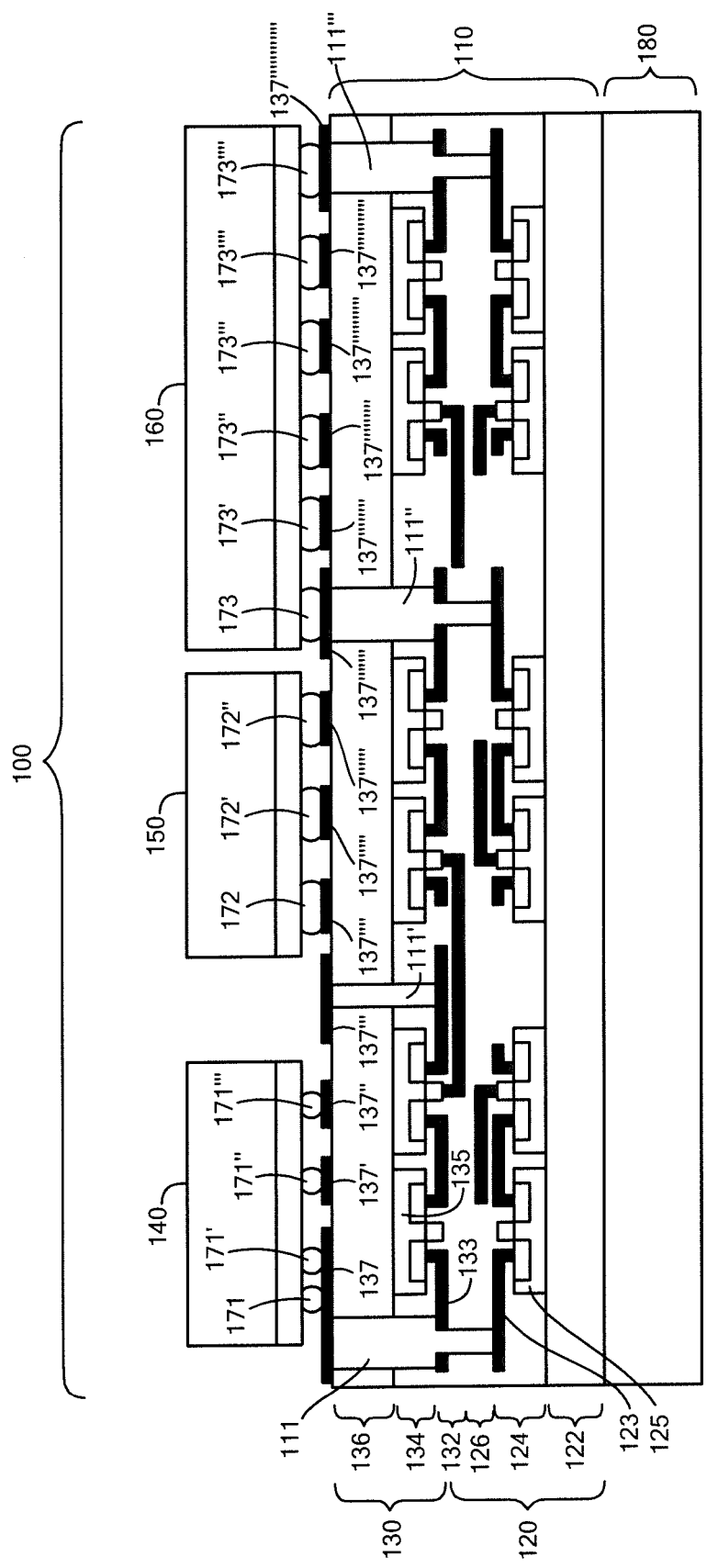
FIGS. 1-1E are block diagrams of example multi-layer semiconductor devices fabricated using a combination of interconnect structures.

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected. Embodiments of the present disclosure and associated advantages may be best understood by referring to the drawings, where like numerals are used for like and corresponding parts throughout the various views. It should, of course, be appreciated that elements shown in the figures are not necessarily drawn to scale. For example, the dimensions of some elements may be exaggerated relative to other elements for clarity.

Definitions

For convenience, certain introductory concepts and terms used in the specification are collected here.

As used here, the term "chemically activated surface" is used to describe a surface which is minimally etched and/or damaged. The hydrophilicity or hydrophobicity of the surface may be changed with appropriate plasma and/or chemical treatment by changing or modifying surface chemistry.

As used herein, the term "circuitized substrate" is used to describe a semiconductor structure including at least one dielectric layer, the at least one dielectric layer having at least one surface on which at least one circuit is disposed. Examples of dielectric materials suitable for the at least one dielectric layer include low temperature co-fired ceramic (LTCC), ceramic (alumina), fiberglass-reinforced or non-reinforced epoxy resins (sometimes referred to simply as FR4 material, meaning its Flame Retardant rating), polytetrafluoroethylene (Teflon), polyimides, polyamides, cyanate resins, photoimagable materials, and other like materials, or combinations thereof. Examples of electrically conductive materials suitable for the at least one circuit include copper and copper alloy. If the dielectric layer is provided from a photoimagable material, it is photoimaged or photopatterned, and developed to reveal the desired circuit pattern, including the desired opening(s) as defined herein, if required. The dielectric layer may be curtain coated or screen applied, or it may be supplied as a dry film or in other sheet form.

As used herein, the term "conductive fusible metal" is used to describe a metal including one or more of tin-lead, bismuth-tin, bismuth-tin-iron, tin, indium, tin-indium, indium-gold, tin-indium-gold, tin-silver, tin-gold, indium, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof. The metals may change forms (e.g., from a solid to a liquid) during a bonding or during post bonding annealing or reflow process.

As used herein, the term "conductive structure" is used to describe an interconnect structure for electrically coupling one or more interconnect pads, electrical connections, components, devices, modules, and semiconductor structures and devices. The conductive structure may include at least one of a micro via having a diameter which is between about one micrometer (μm) and about one-hundred fifty μm's and a sub-micron via having a diameter of less than about one μm.

As used herein, the term "device layer" is used to describe a single or multilayer structure including a number of active or passive semiconductor components, the structure capable of performing at least part of the functional operations (i.e., semiconductor system performance) of a semiconductor structure. Device layers are typically fabricated separately on Silicon on insulator (SOI) substrates or bulk Silicon (Si) substrates. Additionally, each device layer may include at least one interconnect and one or more of active Si, Gallium nitride (GaN) and III-V field-effect transistors (FETs).

As used herein, the term "electronic device" is used to describe an integrated circuit (IC) device (e.g., a semiconductor chip).

As used herein, the term "interposer" is used to describe an interconnect structure capable of electrically coupling two or more semiconductor structures together.

As used herein, the term "module" is used to describe an electrical component having a substrate (e.g., a silicon substrate or printed circuit board (PCB)) on which at least one semiconductor device is disposed. The module may include a plurality of conductive leads adapted for coupling the module to electrical circuitry and/or electrical components located externally of the module. One known example of such a module is a Multi-Chip Module (MCM), such modules coming in a variety of shapes and forms. These can range from pre-packaged chips on a PCB (to mimic the package footprint of an existing chip package) to fully custom chip packages integrating many chips on a High Density Interconnection (HDI) substrate.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied, for example, in a specially programmed microprocessor, a digital signal processor (DSP), or an application specific integrated circuit (ASIC), which can be an analog ASIC or a digital ASIC. Additionally, in some embodiments the "processor" can be embodied in configurable hardware such as field programmable gate arrays (FPGAs) or programmable logic arrays (PLAs). In some embodiments, the "processor" can also be embodied in a microprocessor with associated program memory. Furthermore, in some embodiments the "processor" can be embodied in a discrete electronic circuit, which can be an analog circuit or digital circuit.

As used herein, the term "self-bondable oxide" is used to describe multilayer oxide (e.g., single or multi component, doped or undoped, high density-low density, etc.), the multilayer oxide having at least one chemically activated, ultra-smooth bonding surface (e.g., within a predetermined number of angstroms (Å)) capable of bonding with another self-bondable oxide without any external force. The process for bonding a first self-bondable oxide with a second self-bondable oxide, etc. requires minimum force to activate bonding at a symmetry point on a bonding surface of the first and second self-bondable oxides (e.g. wafers), and little to no additional force to self-propagate bonding to entire surfaces of the first and second self-bondable oxides. Self-bondable oxides preferably use an oxidizing-reducing agent to chemically activate a bonding surface.

RCA cleaning procedures (e.g., RCA-1 clean, RCA-2 clean) and/or high frequency (HF) and/or mega sonic cleaning and/or Plasma (e.g. oxygen) and/or Ammonium Hydroxide may be used for pre-bond surface treatments for the self-bondable oxide. Additionally, annealing the self-bondable oxide at a temperature between about one-hundred fifty degrees Celsius (C) and about five-hundred degrees C. in presence of Hydrogen (H) or Nitrogen (N) may increase bond strength of the self-bondable oxide.

As used herein, the term "substrate" is used to describe any structure upon which an integrated circuit or semiconductor device can be disposed or upon which semiconductor materials can be deposited and/or into which semiconductor materials can be implanted and diffused to form a semiconductor structure or device, for example. In some embodiments, the substrate may be provided as a P-type substrate (i.e., a substrate) having a particular range of concentrations of P-type atoms (i.e., ions). In other embodiments an N-type substrate may be used (i.e., a substrate having a particular range of concentration of N-type atoms).

The substrate may, for example, be provided from a semiconductor material, an insulator material or even a conductor material. For example, the substrate may be provided from silicon, alumina, glass or any other semiconductor material. Further, the substrate can include a number of metal-oxide-silicon (MOS) devices, complementary-MOS (CMOS) devices, or a number of active or passive integrated circuit semiconductor devices.

As used herein, the term "three-dimensional (3-D) integrated circuit (IC)" is used to describe a semiconductor structure including at least two device layers (e.g., which are vertically stacked) and interconnects (e.g., vertical interconnects) to make one or more electrical connections between the device layers.

As used herein, the term "through oxide via (TOV)" is used to describe a via (e.g., micro via) in a semiconductor structure used to connect adjacent device layers. The TOV passes through one or more oxide, dielectric, and/or metal layers and terminates at a predetermined Silicon (Si) layer or surface.

As used herein, the term "via first" is used to describe a micro via and/or a submicro via used to make at least one electrical connection between a first device layer and second device layer in a semiconductor structure including at least two device layers. Additionally, as described here, the term "via" first may also be used to describe a micro via and/or a submicro via passing through a dielectric material or layer (in some embodiments, only the dielectric material or layer) to make at least one electrical connection between a first device layer and a second device layer in a semiconductor structure including at least two device layers. For a via first process, the first device layer and the second device layer are completed separately. As one example, a partial via material is added on first and/or second opposing surfaces (i.e., top and/or bottom surfaces) of the first second device layers and subsequent bonding and/or post bonding process create a via first between the first and second device layers.

The via first may be filled with at least one metal or alloy having a high Coefficient of Thermal Expansion (CTE) to produce a rigid, robust, and conductive via first joint between the at least two device layers during the composite bonding process. High temperatures and/or high pressures may be applied and used to bond the two device layers and provide a three-dimensional (3D) interconnection (i.e., interconnect) among the device layers. The high CTE metal or alloy are expanded at relatively high temperatures and interdiffuse with each other to produce the 3D interconnect. Alternatively, the via first may be filled with a low temperature fusible metal which melts and interdiffuse during bonding or post bonding processes.

As used herein, the term "via last" is used to describe a micro via and/or a submicro via used to make at least one electrical connection between a first device layer and a second device layer in a semiconductor structure including at least two device layers. Fabrication of the first device layer is completed first, and the second device layer is deposited over the first device layer. The second device layer is completed with via last process. A pad layer which includes one or more interconnect pads may be added after via last process. In one embodiment, via last is filled. Additionally, in one embodiment, the via last can be unfilled or partially filled. Via last may pass through the device layers (e.g., second device layers) and, in some embodiments, one or more isolation layers or materials. A titanium (Ti) material having a thickness of about ten nanometers (nm) and, a metal organic chemical vapor deposition (MOCVD) Titanium Nitride (TiN) liner having a thickness of about five nm, and tungsten plugs may be used for via lasts. A MOCVD or chemical vapor deposition (CVD) $TiN_X$, with X less than or equal to 1, is preferred for better conformal coating.

Chemical mechanical polishing (CMP) may be used for planarization of metal filled vias (e.g., micro vias), for example. Additionally, a metal contact (i.e. pad) in an upper device layer (e.g., the second device layer) may be an annulus with an about a one point five micrometer (μm) opening that also functions as a self-aligned mask (e.g., hard mask) during the plasma etch of the oxide beneath it to reach a corresponding metal contact in a lower device layer (e.g., the first device layer). In order to fully dispose and electrically the via, the size of the metal contacts, and thus the pitch of the vertical interconnect, is made proportional to about twice the wafer—wafer misalignment of the wafers including the first and second device layers.

As used herein, the term "wafer—wafer bonding" is used to describe a bonding process in 3-D integrated circuit integration in which: (1) a room-temperature bond is sufficiently strong to prevent wafer slippage between the wafer alignment and wafer bonding processes, since the alignment and a about 150-300 degree Celsius heat treatment takes place in two separate instruments; (2) bonding temperatures do not exceed about 500 degrees C., the upper limit of an aluminum-based interconnect; (3) the bond must be sufficiently strong to withstand the 3-D-fabrication process.

Complementary metal-oxide semiconductor (CMOS) wafers to be bonded are coated with about 1500 nm of a low-temperature oxide (LTO) deposited by low pressure chemical vapor deposition (LPCVD) at a temperature of about 430 degrees C. About 1000 nm of the oxide is removed by chemical mechanical polishing (CMP) to planarize and smooth the surfaces to a roughness of about angstrom level surface roughness. The wafers may be immersed in H2O2 at a temperate of about 80 degrees C. for 10 minutes to remove any organic contaminants and to activate the surfaces with a high density of hydroxyl groups, after which the wafers are rinsed and spun dry in nitrogen in a standard rinse/dryer.

The wafers may be precision aligned to sub-micron accuracy using infrared cameras, for example, to look directly through a top tier substrate (e.g., a first section) and bonded by initiating contact at predetermined point (e.g., a center point) of the top tier substrate. When the surfaces are brought into contact, weak (~0.45 eV) hydrogen bonds may be created at a bonding interface (Si—OH:HO—Si). The bonding interface may propagate radially within about 2-5 seconds to the edge of a wafer pair, and after 30 seconds, the wafer pair can be removed from the aligner without disturbing the bond and wafer alignment. The bond strength is increased by a thermal cycle that creates covalent bonds at the interface from the reaction Si—OH:HO—Si→Si—O—Si+H2O, with the Si—O bond having a bond energy of 4.5 eV. Optimal thermal cycle parameters for this particular bonding technique were determined by measuring bond strengths in the temperature range about 150 degrees C. to about 500 degrees C.

As used herein, the term "system on a chip" or "system on chip" (SoC or SOC) is used to describe an integrated circuit (IC) which integrates substantially all components of an electronic system into a single chip. It may contain digital, analog, mixed-signal, and often radio-frequency functions-all on a single chip substrate. SoC with silicon-on-insulator can provide increased clock speeds while reducing power consumed by the chip.

Multi-die SoCs convert single die SoC into multiple dies. A micro-bump allows on-chip interconnects to be extended to a bridge between chips while allowing other signals to be integrated in a low power manner. Multi-die SoCs can be approached differently. Multi-Die SoCs can have a large die having pads to interconnect with other dies to complete the SoC. The larger die can be relatively easy to fabricate and/or can have minimum yield impact. The larger die can be bumped to create an interconnect for flip-chip bonding with other dies to complete a multi-die SoC. It is further possible that a bumped die will be bonded to the larger die to complete the SoC. It is further possible to attach multiple die to the larger die by flip—chip bonding as well as wire bonding techniques to complete the SoC.

A multi-die SoC can be coupled to a printed circuit board (PCB) and/or substrate by wire bonding. Several non-limiting coupling options are described below. Option 1: Single or multiple die of SoC may be bumped to couple one or more components to a semiconductor structure (e.g., a die), and to create a multi-die SoC. In general, a larger component die which is relatively easy to fabricate will be used for bumping. These kinds of multi-die may prefer to use wirebonding in some embodiments. Alternatively, a larger component die may need to have at least one through via for flip-chip attachment. Option 2: An organic, ceramic, Si based interposer may be used to couple one or more semiconductor structures to the SoC and to create a multi-die SoC. Option 3: A Si based MCM may be used to couple one or more semiconductor structures to the SoC and to create a multi-die SoC.

While multi-layer semiconductor devices including a select number of semiconductor structures (e.g., two or three semiconductor structures) are described in several examples below, the select number of semiconductor structures are discussed to promote simplicity, clarity and understanding in the drawings as well as in the written description of the broad concepts, systems, circuits and techniques sought to be protected herein and is not intended to be, and should not be construed, as limiting. The concepts, systems, circuits and techniques disclosed herein may, of course, be implemented using more than or less than the select number of semiconductor structures.

Additionally, while multi-layer semiconductor devices including semiconductor structures which are the same as or similar to each other are described in several examples below, such are discussed to promote simplicity, clarity and understanding in the drawings as well as in the written description of the broad concepts, systems, circuits and techniques sought to be protected herein and is not intended to be, and should not be construed, as limiting. The concepts, systems, circuits and techniques disclosed herein may, of course, be implemented using semiconductor structures which are different from each other.

Referring now to FIG. 1, an example multi-layer semiconductor device 100 (e.g., a three-dimensional (3-D) integrated circuit (IC) structure) in accordance with the concepts, systems, circuits, and techniques sought to be protected herein is shown. The semiconductor device 100, which illustrates assembly capabilities of semiconductor devices including semiconductor structures of various sizes, shapes, and semiconductor package pitches (also referred to herein as "package pitches") on a same package level (i.e., a same bonding layer) of the semiconductor devices, for example, includes a first semiconductor structure 110, a second semiconductor structure 140, a third semiconductor structure 150, and a fourth semiconductor structure 160.

The semiconductor device 100 also includes a first plurality of interconnect structures (here, interconnect structures 171, 171', 171", 171''') for electrically and mechanically coupling the second semiconductor structure 140 to the first semiconductor structure 110. The semiconductor device 100 additionally includes a second plurality of interconnect structures (here, interconnect structures 172, 172', 172") for electrically and mechanically coupling the third semiconductor structure 130 to the first semiconductor structure 110. The semiconductor device 100 further includes a third plurality of interconnect structures (here, interconnect structures 173, 173', 173", 173''', 173'''', 173''''') for electrically and mechanically coupling the fourth semiconductor structure 160 to the first semiconductor structure 110.

First semiconductor structure 110 (e.g., a wafer or die) has first and second opposing surfaces and includes a plurality of sections (here, three sections). Each of the sections (e.g., functional layers or tiers) includes a plurality of layers (e.g., insulating layers and device layers, as will be discussed). A first one of the sections (e.g., a tier-1 functional section) 120, which is also sometimes referred to herein as a "first section" 120, has first and second opposing surfaces. The first section 120 is fabricated using bulk semiconductor (e.g., bulk complementary metal-oxide semiconductor (CMOS)) fabrication techniques, for example, and includes a first insulating layer 122, a device (or "functional") layer 124 and a second insulating layer 126, each of which also has first and second opposing surfaces.

The first surface of the first insulating layer 122 corresponds to the first surface of the first section 120 and the first surface of first semiconductor structure 110, and the second surface of the second insulating layer 126 corresponds to the second surface of the first section 120 in the illustrated embodiment. Additionally, the first surface of the first insulating layer 122 and the second surface of the second insulating layer 126 each include or are coated with a bondable dielectric material. The device layer 124 is disposed between the second surface of the first insulating layer 122 and the first surface of the second insulating layer 126. In one embodiment, at least one of the first insulating layer 122 and the second insulating layer 126 is provided as part of the device layer 124.

The first insulating layer 122 is provided from one or more electrically insulating materials (e.g., bondable oxide, re-workable oxide, seamless oxide, and/or etch-stoppable oxide). Additionally, the device layer 124 has a plurality of electrical connections (e.g., vias or conductive paths) extending between the first and second surfaces of the device layer 124. The electrical connections (e.g., 123) may, for example, be made by drilling holes through the device layer 124 in appropriate locations and plating the inside of the holes with one or more electrically conductive materials (e.g., Copper (Cu), Nickel (Ni), Titanium (Ti) and Tungsten (W)). The electrical connections may include a combination of materials having so-called "high" and "low" coefficients of thermal expansion (CTE) (e.g., Cu has a "high" CTE of about 16.5 parts per million per degree Centigrade, and W has a "low" CTE of about 4.6 parts per million per degree Centigrade). Example combinations include Ni/Ti and W/Ti/W, Cu/Ti, and Cu/Ni/Ti.

The device layer 124 also includes a plurality of circuit devices (e.g., 125) disposed between the first and second surfaces of the device layer 124. The circuit devices, each of which may be passive or active, for example, are electrically coupled to select ones of the electrical connections (e.g., 123) in the device layer 124. The circuit devices (e.g., transistors) may also be electrically coupled to each other and to one or more other circuit components, devices, and modules (e.g., resistors, inductors, integrated circuits) (not shown) in the device layer 124. Additionally, the circuit devices may be electrically coupled to select electrical connections and select circuit components, device, and modules in one or more other sections (e.g., second section) of the semiconductor device 100 (e.g., through one or more conductive structures, as will be discussed).

The second insulating layer 126, which may be the same as or similar to the first insulating layer 122 in some embodiments, is disposed (or deposited) over the second surface of the device layer 124. The second insulating layer 126 may, for example, electrically insulate the device layer 124 from other device layers of first semiconductor structure 110 (e.g., device layer 134, as will be discussed). In one embodiment, each of the first insulating layer 122 and the second insulating layer 126 has a thickness (i.e., a distance between the first and second opposing surfaces) of less than about a micron. In one embodiment, the thickness is between about five-hundred nanometers (nm) and about nine-hundred nm.

A second one of the sections (e.g., a tier-2 functional section) 130, which is also sometimes referred to herein as a "second section" 130, has first and second opposing surfaces and is fabricated using at least Silicon-On-Insulator (SOI) fabrication techniques in the illustrated embodiment. The first surface of the second section 130, which includes or is coated with a bondable dielectric material (e.g., a self-bondable dielectric material) having a same or similar surface roughness as the bondable dielectric material of the first section 120 (i.e., a common dielectric material), is disposed over and coupled to the second surface of the first section 120 (e.g., using oxide bonding techniques). Additionally, the second section 130 is electrically coupled to the first section 120 using conductive structures (e.g., conductive structures 111, 111', 111", 111''', as will be discussed).

The second section 130 includes a first insulating layer 132 which may be the same as or similar to first insulating layer 122 of first section 120. The second section 130 also includes a device layer 134 which may be the same as or similar to device layer 124 of first section 120. The second section 130 additionally includes a second insulating layer 136 which may be the same as or similar to second insulating layer 126 of first section 126. A first surface of the first insulating layer 132 corresponds to the first surface of the second section 130, and a second surface of the second insulating layer 136 corresponds to the second surface of the second section 130 and a second surface of first semiconductor structure 110 in the illustrated embodiment. The device layer 134 is disposed between a second surface of the first insulating layer 132 and a first surface of the second insulating layer 136. Similar to device layer 124 of first section 120, device layer 134 of second section 130 has a plurality of electrical connections (e.g., 133) extending between first and second surfaces of the device layer 134. Device layer 134 also includes a plurality of circuit devices (e.g., 135) disposed between the first and second surfaces of the device layer 134.

The second section 130 additionally includes a plurality of interconnect pads (here, interconnect pads 137-137""""""). Interconnect pads 137-137"""""" (e.g., solderable metal pads) each have first and second opposing surfaces and a plurality of sides. Additionally, interconnect pads 137-137"""""" are each provided in a pattern or shape which promotes scalability of the semiconductor device 100 (e.g., for electrically coupling second semiconductor structure 140 to first semiconductor structure 110, as will be discussed). Interconnect pads 137-137"""""" may also be each shaped or sized according to semiconductor package pitch requirements of a corresponding semiconductor structure (e.g., second semiconductor structure 140, third semiconductor structure 150, and fourth semiconductor structure 160) to which the interconnect pads 137-137"""""" are to be coupled Additionally, in one embodiment, interconnect pads 137-137"""""" each include a thin-film stack of materials (e.g., Ti/Pt/Au, Ni/Au) (not shown) which provides an electrical connection from second section 130 to interconnect structures 171-171'''. The thin-film stacks can also provide a barrier function to limit unwanted diffusion from the interconnect structures 171-171''' to second section 130. The thin-film stacks can further provide a mechanical interconnection between the interconnect structures 171-171''' and the second section 130 through adhesion to the second section 130 die passivation and attachment to corresponding interconnect pads (e.g., microbump pads) of second semiconductor structure 140. In the illustrated embodiment, a first surface of interconnect pads 137-137"""""" is disposed over or beneath (e.g., attached or otherwise coupled to) select portions of the second surface of the second section 130 using techniques well known to those of ordinary skill in the art.

The first semiconductor structure 110 also includes a plurality of conductive structures (here, conductive structures 111, 111', 111", 111''') extending between select ones of the electrical connections in the first section 120, and/or select ones of the electrical connections in the device layer of the second section 130. In one embodiment, at least one of conductive structures 111, 111', 111", 111''' (e.g., 3D vias) is provided as a through oxide via (TOV) or a through insulator via (TIV) conductive structure. Example conductive materials for conductive structures 111, 111', 111", 111''' (e.g., micro vias and/or sub-micron vias) include, but are not limited to: titanium, titanium-nitride, tungsten and/or other suitable electrically conductive materials.

Select ones of the conductive structures (e.g., 111) in first semiconductor structure 110 are electrically coupled to select ones of the interconnect pads (e.g., 137). The electrical coupling may, for example, occur through bond wires or via contacts spaced between the first surface of the interconnect pads and the conductive structures in a region below the interconnect pads.

Additionally aspects of semiconductor structures which are similar to first semiconductor structure 110 are described in co-pending International Application No. PCT/US2015/044608 entitled "Interconnect Structures For Assembly of Multi-layer Semiconductor Devices," which is assigned to the assignee of the present disclosure and incorporated herein by reference in its entirety.

The second semiconductor structure 140 (e.g., a two-dimensional (2D) integrated circuit (IC) structure) has first and second opposing surfaces and is electrically coupled to the first semiconductor structure 110 though first interconnect structures 171, 171', 171", 171''' (e.g., ball grid array (BGA) solder balls, controlled collapse chip connection (C4) bumps, Cu pillars, solder coated Cu micro pillars, and the like). The second semiconductor structure 140 (e.g., a radio frequency (RF) IC) has a second package pitch, and the interconnect structures 171, 171', 171", 171''' each have dimensions selected in accordance with the second package pitch. Second semiconductor structure 140 may be electrically coupled to first semiconductor structure 110 using chip-to-chip attachment techniques, for example. One example "small" pitch for the second package pitch is about fifteen micron. Additionally, one example "larger" pitch for the second package pitch can be between about one hundred micron and about one hundred fifty micron.

A first portion of second semiconductor structure 140 is electrically coupled to the second surface of interconnect pad 137 of first semiconductor structure 110 through interconnect structures 171, 171'. Additionally, a second portion of second semiconductor structure 140 is electrically coupled to the second surface of interconnect pad 137' of first semiconductor structure 110 through interconnect structure 171". Further, a third portion of second semiconductor structure 140 is electrically coupled to the second surface of interconnect pad 137" of first semiconductor structure 110 through interconnect structure 171'''. Second semiconductor structure 140 may, for example, allow for the mixing and matching of various semiconductor structures (e.g., integrated circuits) into semiconductor device 100, each of the semiconductor structures fabricated using one or more fabrication techniques, technologies and materials.

The third semiconductor structure 150 (e.g., a 2D IC structure) has first and second opposing surfaces and is electrically coupled to the first semiconductor structure 110 though second interconnect structures 172, 172', 172". The third semiconductor structure 150 (e.g., a Dynamic random-access memory (DRAM) IC) has a third package pitch, and the interconnect structures 172, 172', 172" each have dimensions selected in accordance with the third package pitch. Third semiconductor structure 150 may be electrically coupled to first semiconductor structure 110 using chip-to-chip attachment techniques, for example. One example "small" pitch for the third package pitch is about fifteen micron. Additionally, one example "larger" pitch for the third package pitch can be between about one hundred micron and about one hundred fifty micron.

A first portion of third semiconductor structure 150 is electrically coupled to the second surface of interconnect pad 137"" of first semiconductor structure 110 through interconnect structure 172. Additionally, a second portion of third semiconductor structure 150 is electrically coupled to the second surface of interconnect pad 137''''' of first semiconductor structure 110 through interconnect structure 172'. Further, a third portion of third semiconductor structure 150 is electrically coupled to the second surface of interconnect pad 137'''''' first semiconductor structure 110 through interconnect structure 172". Third semiconductor structure 150 may, for example, allow for the mixing and matching of various semiconductor structures (e.g., integrated circuits) into semiconductor device 100, each of the semiconductor structures fabricated using one or more fabrication techniques, technologies and materials.

The fourth semiconductor structure 160 (e.g., a 2D IC structure) has first and second opposing surfaces and is electrically coupled to the first semiconductor structure 110 though third interconnect structures 173, 173', 173", 173''', 173'''', 173'''''. The fourth semiconductor structure 160 (e.g., a graphics processing unit (GPU) IC) has a fourth package pitch, and the interconnect structures 173, 173', 173", 173''', 173'''', 173''''' each have dimensions selected in accordance with the fourth package pitch. Fourth semiconductor structure 160 may be electrically coupled to first semiconductor structure 110 using chip-to-chip attachment techniques, for example. One example "small" pitch for the fourth package pitch is about fifteen micron. Additionally, one example "larger" pitch for the fourth package pitch can be between about one hundred micron and about one hundred fifty micron.

A first portion of fourth semiconductor structure 160 is electrically coupled to the second surface of interconnect pad 137'''''' of first semiconductor structure 110 through interconnect structure 173, and a second portion of fourth semiconductor structure 160 is electrically coupled to the second surface of interconnect pad 137''''''' of first semiconductor structure 110 through interconnect structure 173'. Additionally, a third portion of fourth semiconductor structure 160 is electrically coupled to the second surface of interconnect pad 137'''''''' of first semiconductor structure 110 through interconnect structure 173", and a fourth portion of fourth semiconductor structure 160 is electrically coupled to the second surface of interconnect pad 137''''''''' of first semiconductor structure 110 through interconnect structure 173'''.

Further, a fifth portion of fourth semiconductor structure 160 is electrically coupled to the second surface of interconnect pad 137'''''''''' of first semiconductor structure 110 through interconnect structure 173'''', and a sixth portion of fourth semiconductor structure 160 is electrically coupled to the second surface of interconnect pad 137''''''''''' of first semiconductor structure 110 through interconnect structure 173'''''. Fourth semiconductor structure 160 may, for example, allow for the mixing and matching of various semiconductor structures (e.g., integrated circuits) into semiconductor device 100, each of the semiconductor structures fabricated using one or more fabrication techniques, technologies and materials.

Semiconductor device 100 further includes an optional support or "handle" structure (e.g., a handle substrate) 180 having first and second opposing surfaces. The handle structure 180, which may be provided from Silicon (Si), Silicon carbide (SiC) and/or Sapphire as a few examples, may be used for coupling semiconductor device 100 (or first semiconductor structure 110) to machinery for aligning and coupling semiconductor device 100 (or first semiconductor structure 110) to other semiconductor devices or structures, for example. In the example embodiment shown, the second surface of the handle structure 180 is disposed over and coupled to the first surface of first semiconductor structure 110. The handle structure 180 may be provided as part of or separate from the first semiconductor structure 110.

In one embodiment, a predetermined distance of between about five micrometers (μm) and about fifty μm exists between the first and second portions of interconnect structures 171, 171', 171", 171'''. In one embodiment, interconnect structures 171, 171', 171", 171''' are provided as Indium microbumps having a diameter of about fifteen micron and a height of between about six and about fifteen micron. After thermocompression bonding below melting temperature (90-110 C), for example, as may be desirable in some embodiments, the height of interconnect structure 171, 171', 171", 171''' may be reduced to between about two micron and about four micron. By reducing bonding force during thermocompression bonding, the height of interconnect structures 171, 171', 171", 171''' can be increased (e.g., to between about five micron and about seven micron).

Further, in one embodiment a predetermined distance of between about seventy five μm and about one hundred μm exists between the first and second portions of interconnect structures 172, 172', 172". Further, in one embodiment a predetermined distance of between about one hundred fifty micrometers (μm) and about two hundred fifty μm exists between the first and second portions of interconnect structures 173, 173', 173", 173''', 173'''', 173'''''. The predetermined distances may, for example, be selected based upon at least one of the size, shape and package pitch of the corresponding semiconductor structures.

In accordance with the concepts, systems, circuits, and techniques sought to be protected herein, by fabricating the semiconductor device 100 using a combination of interconnect structures (e.g., 171, 172, 173) and, in some embodiments, selecting dimensions of interconnect pads (e.g., 155) of corresponding semiconductor structures based on these interconnect structures, the semiconductor device 100 is provided having a number of semiconductor structures (e.g., 110, 140, 150, 160) with various sizes, shapes and package pitches in a same layer of the semiconductor device 100.

In one aspect of the concepts, systems, circuits and techniques sought to be protected herein, FIG. 1 illustrates microbump technology capable of combining a multi-die SOC (e.g., a multi-die SOC including semiconductor structures 140, 150, 160) and a 3DIC (e.g., semiconductor structure 110) into a single package (e.g., a single package of semiconductor device 100) by joining a variety of arbitrary structures to produce various shapes, sizes and pitches on a same package level of a semiconductor device (e.g., 100). It is possible to use microbump technology having single microbumps (e.g., 171-171''') for a finer pitch structure (e.g., 140) and a multiple microbump array for a larger pitch structure (e.g., 150 and 160) to provide for a semiconductor device (e.g., 100) which is capable of maintaining a finer pitch structure as well as a larger pitch structure in a same packaging layer.

In one embodiment, the interconnect structures described above in conjunction with FIG. 1 (e.g., 171, 172, 173), and the interconnect structures described in conjunction with the figures below, may be provided as multi-die SoC interconnects. In one embodiment, a multi-die SoC interconnect includes a microbump and an under bump metallurgy (UBM) where the microbump is capable of reacting with at least part of the UBM at an interface to create a higher temperature melt interface. In one embodiment, the interface melts at a higher temperature than at least one of the components of the microbump and/or the UBM. It is also possible to create a concentration gradient at the interface which melts at a higher temperature than the microbump and/or UBM. In one embodiment, the microbump and the UBM grow together on a nano-grain low surface energy surface. Such may allow for the creation of a same diameter microbump and UBM. An interconnect pad (e.g., 155) to which the microbump and/or the UMB are coupled to or provided as part of may be fabricated to have a low surface energy, non wettable surface. Side walls of the interconnects (e.g., 171) may contain nano, sub-micro and micro grain/particle structures to prevent melt flow by reacting/diffusing with the low melt phase. In one embodiment, the interconnects are surrounded by a polymer matrix capable of reducing as well increasing viscosity at or below curing temperature until final curing.

Further, in some embodiments, one or more anisotropic conductive films or adhesives can be used as part of the interconnects (or interconnect structures) described in the above or below figures. The anisotropic conductive films or adhesives may include an adhesive polymer matrix with a substantially randomly dispersed conductive filler with tight size distributions. The conductive filler can be metal and or alloy, metal coated and or alloy coated polymer sphere, conductive polymer spheres, metal coated and or alloy coated conductive polymer sphere. The conductive filler in the polymer matrix may form an electrical path between the interconnects disposed between semiconductor structures.

Additional aspects of the concepts, systems, circuits and techniques sought to be protected herein, with particular emphasis on the interconnect structures (e.g., 171), are described in conjunction with the figures below.

Figure 1A:
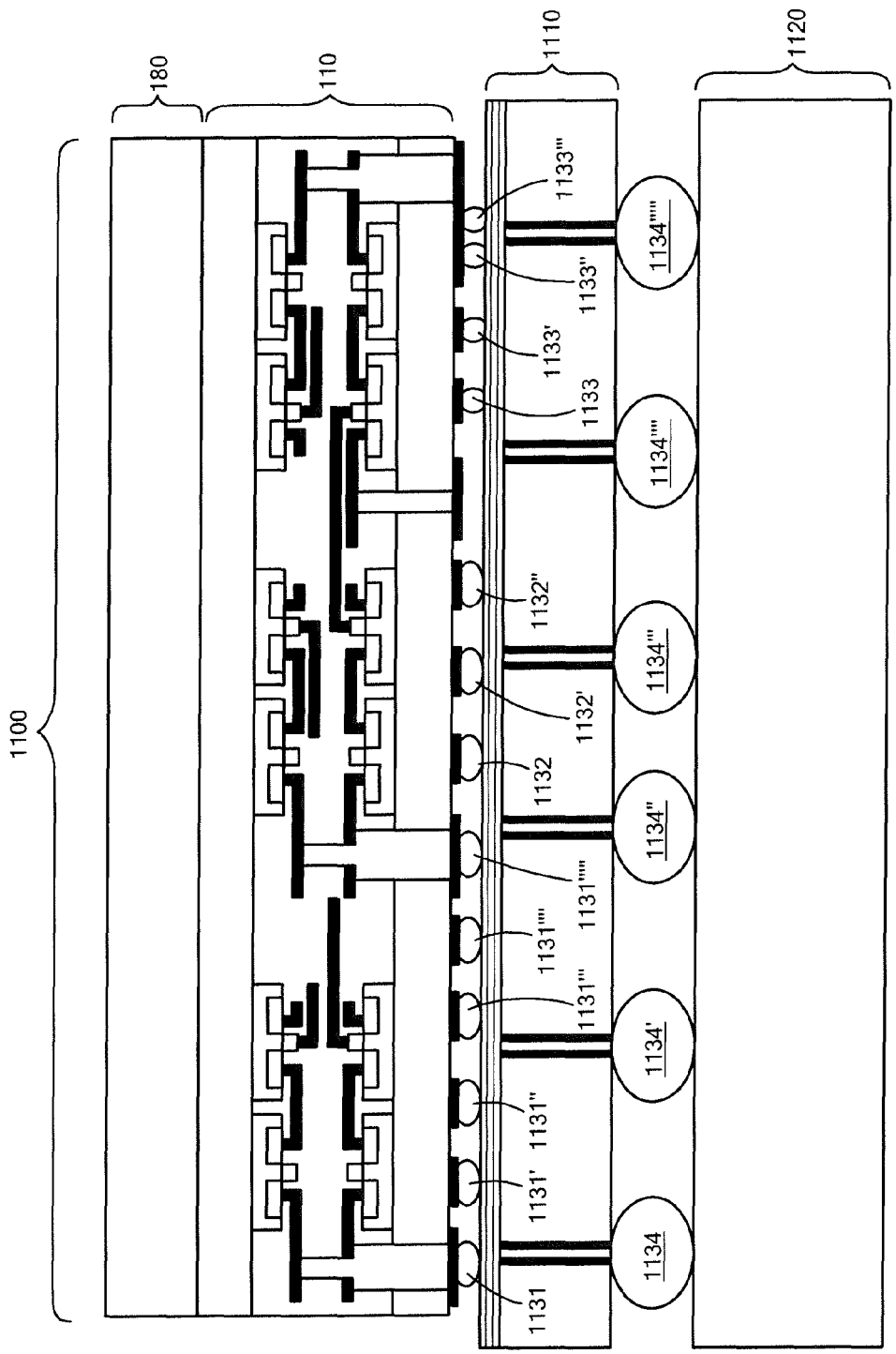

Referring now to FIG. 1A, in which like elements of FIG. 1 are provided having like reference designations, an example multi-layer semiconductor device 1100 includes first semiconductor structure 110 and handle structure 180. Semiconductor device 1100 also includes a second semiconductor structure 1110 and a third conductive structure 1120. Semiconductor device 1100 additionally includes a first plurality of interconnect structures (here, interconnect structures 1131, 1131', 1131", 1131''', 1131'''', 1131'''''), a second plurality of interconnect structures (here, interconnect structures 1132, 1132', 1132") and third plurality of interconnect structures (here, interconnect structures 1133, 1133', 1133", and 1133''') for electrically and mechanically coupling the second semiconductor structure 1110 to the first semiconductor structure 110.

The pitch of the first, second, and third plurality interconnect structure can, for example, be different if the density of first semiconductor structure 110 varies. A low density area of first semiconductor structure 110 may, for example, have a "larger" pitch and require "larger" pitch interconnect structures. Additionally, a high density area of first semiconductor structure 110 may, for example, have a "smaller" pitch and require "smaller" pitch interconnect structures. First semiconductor structure 110 can have a micro via based connection which requires a small (or smaller) pitch. 3D vias, which may be provided in first semiconductor structure 110 in some embodiments, for example, typically favor larger pitches relative to micro via connections. Returning now to semiconductor device 1100, in the illustrated embodiment semiconductor device 1100 further includes a fourth plurality of interconnect structures (here, interconnect structures 1134, 1134', 1134", 1134''', 1134'''', 1134''''') for electrically and mechanically coupling the third semiconductor structure 1120 to the second semiconductor structure 1110.

Second semiconductor structure 1110 (e.g., a wafer or die), which is provided as a multi-chip module (MCM) assembly (e.g., Silicon based MCM, ceramic based MCM, or organic MCM) or an interposer (e.g., Silicon based interposer) in the illustrated embodiment, has first and second opposing surfaces and a plurality of electrical connections (e.g., vias or conductive paths) extending between select portions of the first and second surfaces. In one embodiment, the electrical connections are provided as through silicon via (TSV) structures.

A first portion of second semiconductor structure 1110, which may be electrically coupled to first select ones of the electrical connections in second semiconductor structure 1110, has a first package pitch and is coupled to interconnect pads 137'''''''''-137'''''''' of first semiconductor structure 110 through interconnect structures 1131, 1131', 1131", 1131''', 1131'''', 1131'''''. Additionally, a second portion of second semiconductor structure 1110, which may be electrically coupled to second select ones of the electrical connections in second semiconductor structure 1110, has a second package pitch and is coupled to interconnect pads 137'''''-137'''' of first semiconductor structure through interconnect structures 1132, 1132', 1132". Further, a third portion of second semiconductor structure 1110, which may be electrically coupled to third select ones of the electrical connections in second semiconductor structure 1110, has a third package pitch and is coupled to interconnect pads 137"-137 of first semiconductor structure 110 through interconnect structures 1133, 1133', 1133", 1133'''.

Third semiconductor structure 1120, which is provided as a printed circuit board or a substrate in the illustrated embodiment, has first and second opposing surfaces and a fourth package pitch. The second surface of third semiconductor structure 1120 is electrically coupled to the first surface of second semiconductor structure 1110 through interconnect structures 1134, 1134', 1134", 1134''', 1134'''', 1134'''''.

Similar to the interconnect structures (e.g., 151) of multi-layer semiconductor device 100 of FIG. 1, dimensions of the interconnect structures (e.g., 131) of multi-layer semiconductor device 1100 are select based at least in part on the package pitch of a corresponding semiconductor structure (or portion of a semiconductor structure). Additionally, in one embodiment, the interconnect structures (e.g., 131) form a bump (e.g., micro bump) assembly on a corresponding surface of the semiconductor structure.

Figure 1B:
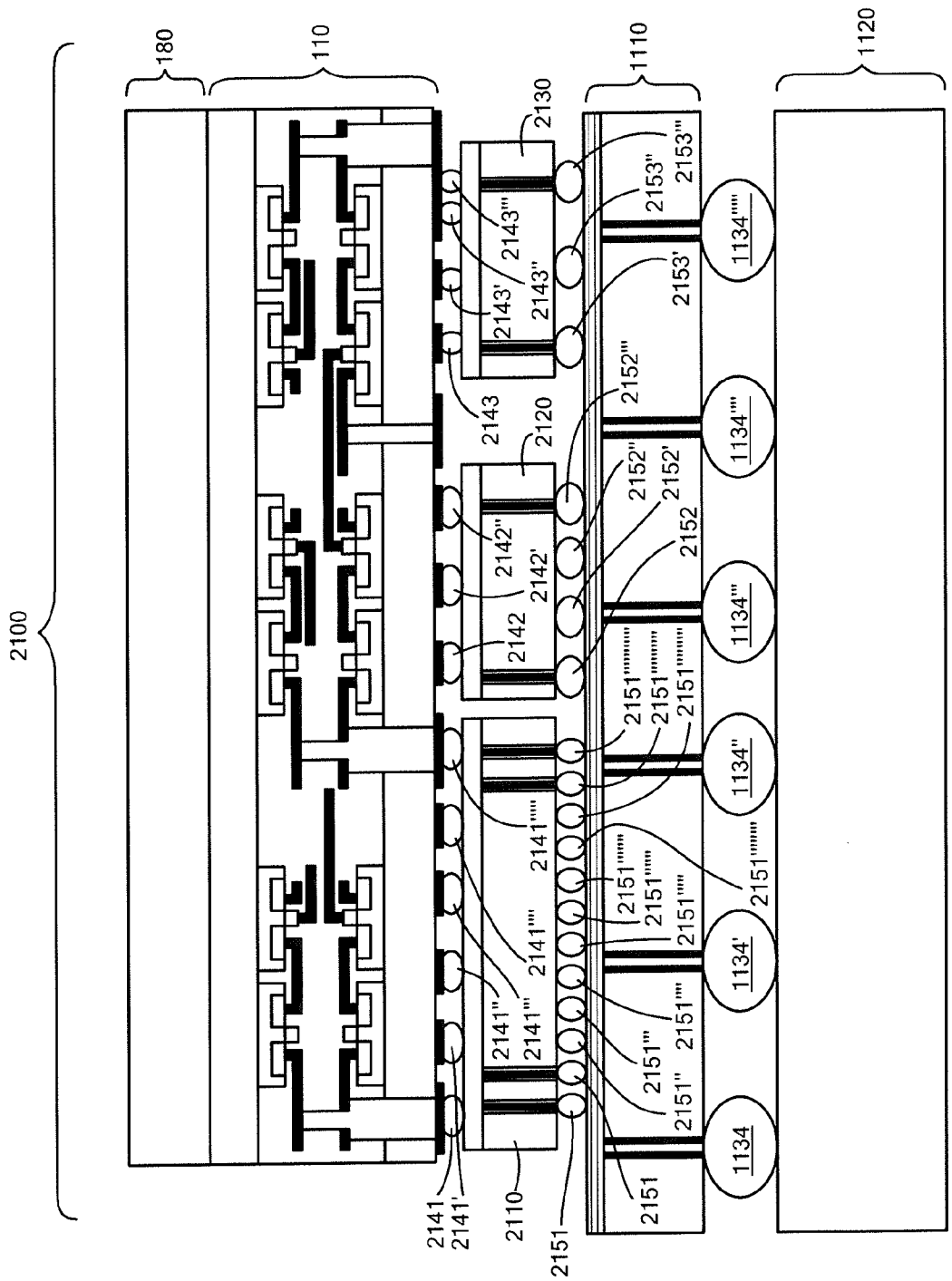

Referring now to FIG. 1B, another example multi-layer semiconductor device 2100 fabricated using a combination of interconnect structures is shown. Semiconductor device 2100 includes first semiconductor structure 110, handle structure 180, second semiconductor structure 1110, and third semiconductor structure 1120.

In the illustrated embodiment, semiconductor device 2100 additionally includes a fourth semiconductor structure 2110, a fifth semiconductor structure 2120 and a sixth semiconductor structure 2130. Fourth semiconductor structure 2110 (e.g., a graphics processing unit (GPU)) has a fourth package pitch and is electrically coupled to first semiconductor structure 110 through interconnect structures 2141, 2141', 2141", 2141''', 2141'''', and 2141'''''. Additionally, fourth semiconductor structure 2110 is electrically coupled to second semiconductor structure 1110 through interconnect structures 2151-2151''''''''.

Fifth semiconductor structure 2120 (e.g., Dynamic random-access memory (DRAM)) has a fifth package pitch and is electrically coupled to first semiconductor structure 110 through interconnect structures 2142, 2142', 2142". Additionally, fifth semiconductor structure 2120 is electrically coupled to second semiconductor structure 1110 through interconnect structures 2152, 2152', 2152", 2152'".

Sixth semiconductor structure 2130 (e.g., a radio frequency (RF) IC) has a sixth package pitch and is electrically coupled to first semiconductor structure 110 through interconnect structures 2143, 2143', 2143", 2143'". Additionally, sixth semiconductor structure 2130 is electrically coupled to second semiconductor structure 1110 through interconnect structures 2153, 2153', 2153".

In one embodiment, the package pitch of at least a first one of the semiconductor structures (e.g., fourth semiconductor structure 2110) is the same as or similar to the package pitch of a second one of the semiconductor structures (e.g., fifth semiconductor structure 2120). In this embodiment, one or more of the interconnect structures (e.g., 2141) for the first one of the semiconductor structures may have same or similar dimensions as one or more of the interconnect structures (e.g., 2142) for the second one of the semiconductor structures, for example.

In one aspect of the concepts, systems, circuits and techniques sought to be protected herein, FIG. 1B illustrates microbump technology capable of combining a multi-die SOC (e.g., a multi-die SOC which includes fourth semiconductor structure 2110, fifth semiconductor structure 2120 and/or sixth semiconductor structure 2130) and a 3DIC (e.g., semiconductor structure 110) into a single package by joining a variety of arbitrary structures to produce various shapes, sizes and pitches on a same package level. It is possible to use microbump technology having single microbump (2141-2141'"'") for a finer pitch structure (e.g., 2110) and a multiple microbump array for larger pitch structure (e.g., 2120 and 2130) to provide for a semiconductor device (e.g., 2100) which is capable of maintaining a finer pitch structure as well as a larger pitch structure in the same packaging layer.

In one embodiment, at least one of the semiconductor structures (e.g., 2210) in the multi-die SoC includes a through silicon via (TSV) structure and/or a redistribution layer. The at least one of the semiconductor structures may be coupled to one or more other semiconductor structures (e.g., 1110) in the semiconductor device which may have a same or different size interconnect and/or pitch. In the illustrated embodiment, semiconductor structure 1110 may include through via and/or blind vias and/or stacked vias and/or staggered via and use microbump technology having microbumps (e.g., 1134) to attach semiconductor structure 1110 to semiconductor structure 1120.

Additionally, in one embodiment, interconnect density decreases from interconnect structures 2141-2141'"'" to 2151-2151'"'"'"'", and from 2151-2151'"'"'"'" to 1134-1134'"'", with pitch increasing with increasing size of the interconnect structures. Further, in one embodiments, one or more of the interconnect structures (e.g., 2141, 2151, 1134) may be surrounded by a polymer matrix which is at least once capable of reducing as well increasing viscosity at or below a curing temperature till final curing.

In one embodiment, the Interconnect structures are surrounded by a polymer matrix to provide mechanical stability, long term reliability and finer pitch capability. The polymer matrix may initially be able to reduce viscosity at or below curing temperature and start buildup viscosity after that until final curing. Additionally, the polymer matrix may contain either a single composition of materials or a mixture of various compositions. One example composition may include Epoxy resins, non-volatile solvent free liquid epoxy diluent, activating agent and/or thixotropic agent. Another example composition may include a monomer and/or a oligomer and/or a polymer (high or low molecular weight) based system.

Another example composition may include a nano and/or a micro filler with or without surface modification containing various levels of porosity to disperse within polymer matrix. A cross linking agent may also be included also in the polymer matrix to act as a fluxing agent. Examples of such cross linking agents are carboxyl acid and/or amino based systems. It is further possible to use an epoxy and/or ether and/or phenol and/or organic acid and/or terminal epoxides and/or anhydride and/or hydrogenated castor oil and/or filler in the polymer matrix. Other components including Silica and/or fibers and/or carbon black and/or quartz and/or alumna, solvent, thermosetting and/or thermoplastic resin can also be provided as part of the polymer matrix. Components can react with each other during a curing process to produce an interlinked polymer matrix.

Figure 1C:
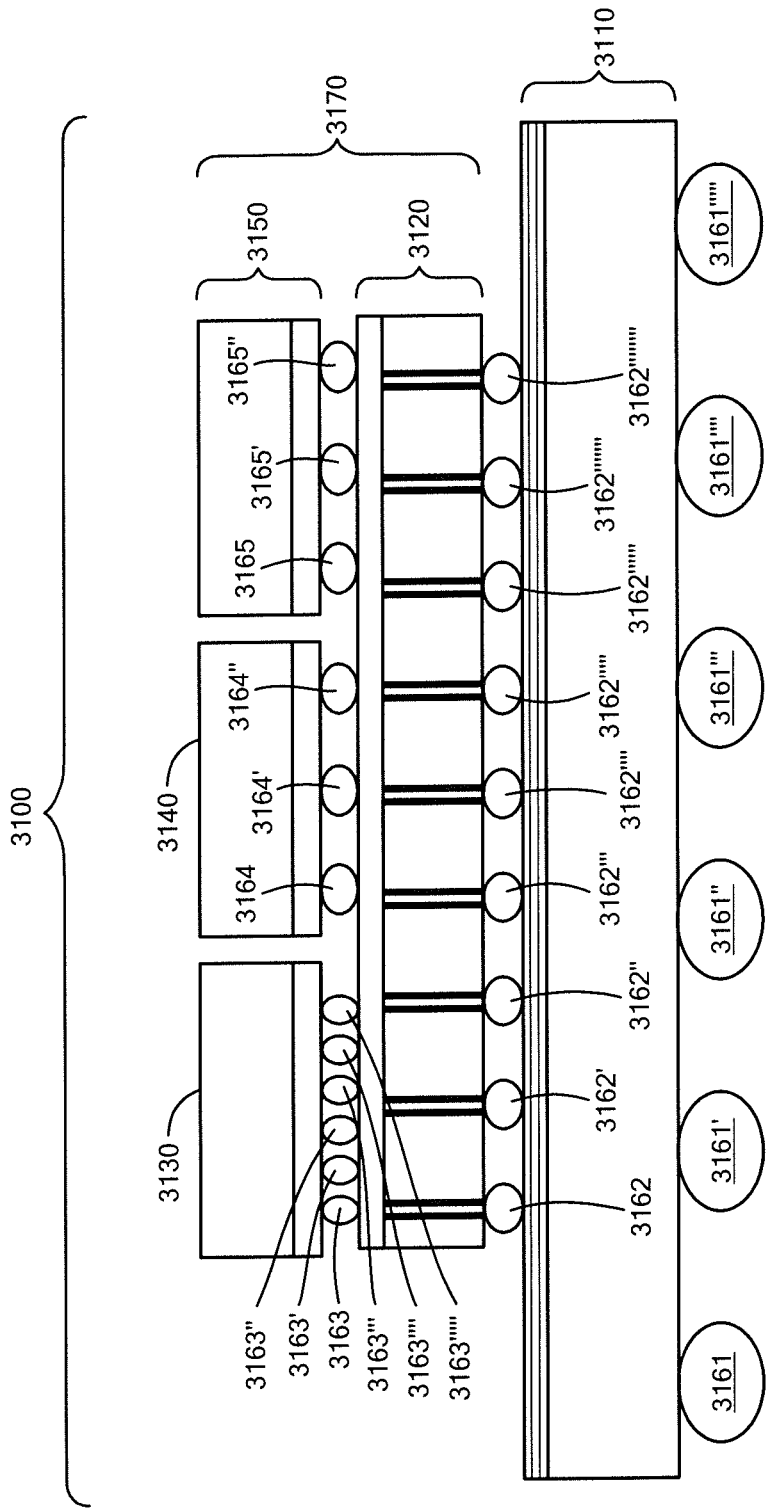

Referring now to FIG. 1C, another example multi-layer semiconductor device 3100 includes a first semiconductor structure 3110, a second semiconductor structure 3120, and a third semiconductor structure 3130. Semiconductor device 3100 also includes a fourth semiconductor structure 3140 and a fifth semiconductor structure 3150.

First semiconductor structure 3110 (e.g., an organic MCM) has a first package pitch and a plurality of interconnect structures (here, interconnect structures 3161, 3161', 3161", 3161'", 3161'"', 3161'"'') disposed beneath a second surface of first semiconductor 3110. Interconnect structures 3161, 3161', 3161", 3161'", 3161'"', 3161'"'' may, for example, be used for coupling first semiconductor structure 3110 to one or more other semiconductor structures or devices which are not shown in the figure.

Second semiconductor structure 3120 (e.g., an MCM or interposer) has a second package pitch and is electrically coupled to a first surface of first semiconductor structure 3110 through interconnect structures 3162-3162'"'"'". Additionally, third semiconductor structure 3130 (e.g., an RF IC) has a third package pitch and is electrically coupled to a first portion of a second surface of second semiconductor structure 3120 through interconnect structures 3163, 3163', 3163", 3163'", 3163'"', 3163'"''.

Fourth semiconductor structure 3140 (e.g., a central processing unit (CPU) IC) has a fourth package pitch and is electrically coupled to a second portion of the second surface of second semiconductor structure 3140 through interconnect structures 3164, 3164', 3164". Further, fifth semiconductor structure 3150 (e.g., a GPU IC) has a fifth package pitch and is electrically coupled to a third portion of the second surface of second semiconductor structure 3120 through interconnect structures 3165, 3165', 3165".

In one embodiment, two or more of the second semiconductor structure 3120, the third semiconductor structure 3130, the fourth semiconductor structure 3140 and the fifth semiconductor structure 3150 are provided as part of a multi-die system-on-a-chip (SOC) assembly 3170.

In one aspect of the concepts, systems, circuits and techniques sought to be protected herein, FIG. 1C illustrates microbump technology capable of combining a multi-die SOC (e.g., 170) into a single package by joining a variety of arbitrary structures to produce various shape, size and pitch on a same package level. It is possible to use microbump technology having single microbump (e.g., 3163) for finer pitch structure (e.g., 3130) and multiple microbump array for larger pitch structure (e.g., 3140 and 3150) to provide for a semiconductor device (e.g., 3100) which is capable of maintaining a finer pitch structure as well as larger pitch structure in the same packaging layer.

Figure 1D:
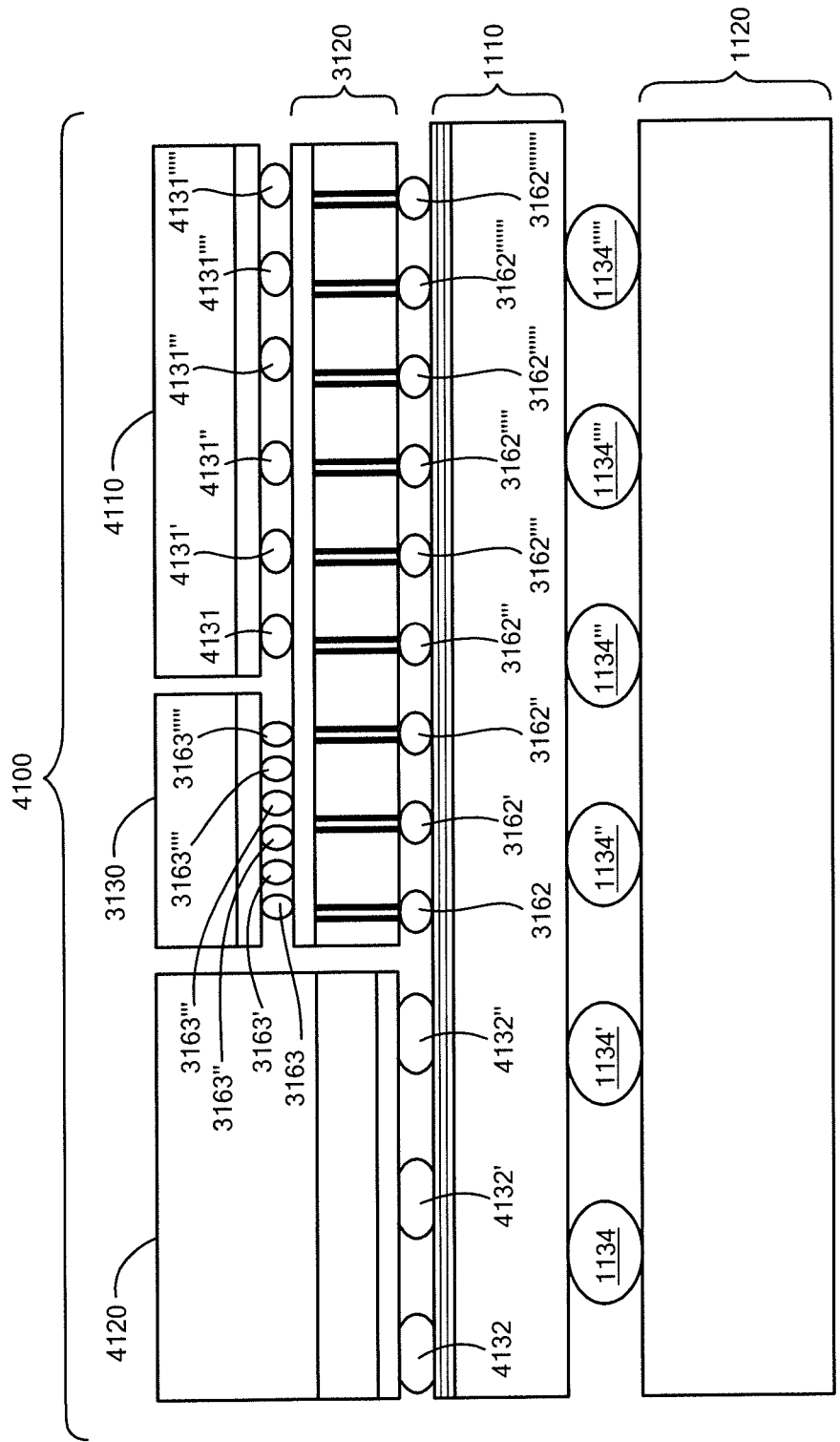

Referring now to FIG. 1D, another example multi-layer semiconductor device 4100 includes semiconductor structure 1120 (here, a first semiconductor structure 1120) and semiconductor structure 1110 (here, a second semiconductor structure 1110). Semiconductor device 4100 also includes semiconductor structure 3120 (here, a third semiconductor structure 3120) and semiconductor structure 3130 (here, a fourth semiconductor structure 3130).

In the illustrated embodiment, semiconductor device 4100 additionally includes a fifth semiconductor structure 4110 and a sixth semiconductor structure 4120. Second semiconductor structure 1110 has a second package pitch and is electrically coupled to a first surface of first semiconductor structure 1120 through interconnect structures 1134, 1134', 1134", 1134''', 1134'''', 1134'''''. Additionally, third semiconductor structure 3120 has a third package pitch and is electrically coupled to a first portion of a second surface of second semiconductor structure 1110 through interconnect structures 3162-3162'''''.

Fourth semiconductor structure 3130 has a fourth package pitch and is electrically coupled to a first portion of a second surface of third semiconductor structure 3120 through interconnect structures 3163, 3163', 3163", 3163''', 3163'''', 3163'''''. Further, fifth semiconductor structure 4120 (e.g., a GPU IC) has a fifth package pitch and is electrically coupled to a second portion of the second surface of third semiconductor structure 3120 through interconnect structures 4131, 4131', 4131", 4131''', 4131''''.

Sixth semiconductor structure 4120 (e.g., a packaged die) has a sixth package pitch and is electrically coupled to a second portion of the second surface of second semiconductor structure 1110 through interconnect structures 4132, 4132', 4132". In one embodiment, two or more of the third semiconductor structure 3120, the fourth semiconductor structure 3130, and the fifth semiconductor structure 4110 are provided as part of a multi-die SOC assembly.

In one aspect of the concepts, systems, circuits and techniques sought to be protected herein, FIG. 1D illustrates microbump technology capable of producing interconnects of various shapes, sizes and pitches on a same package level of a semiconductor device (e.g., semiconductor device 4100). Such may allow for the creation of complex packaging where bare die and packaged die can be assembled together within a same package layer (or level).

Figure 1E:
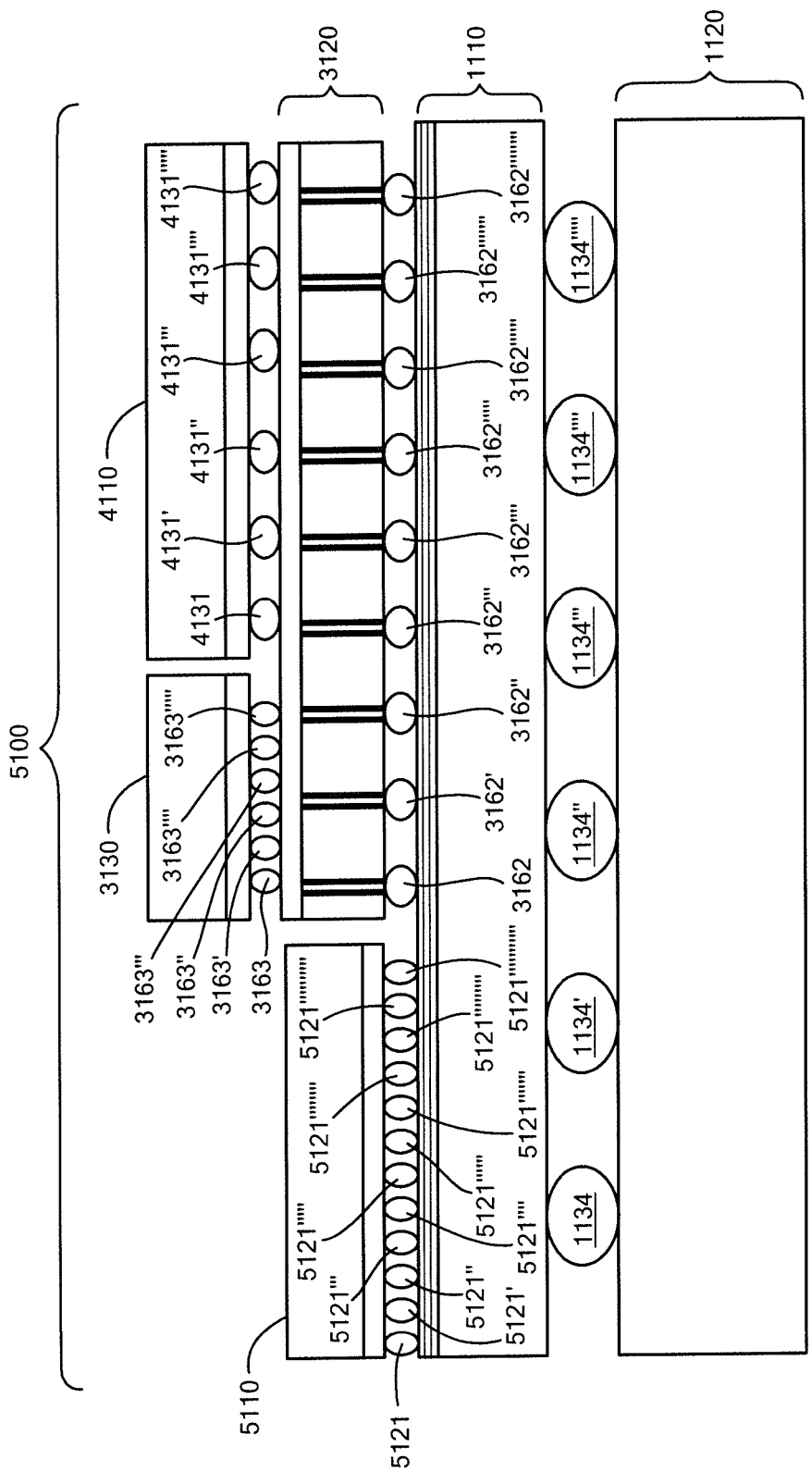

Referring now to FIG. 1E, in which like elements of FIG. 1 are provided having like reference designations, an example multi-layer semiconductor device 5100 includes first semiconductor structure 1120, second semiconductor structure 1110, and third semiconductor structure 3120. Semiconductor device 5100 also includes fourth semiconductor device 3130 and fifth semiconductor device 4110. In the illustrated embodiment, semiconductor device 5100 additionally includes a sixth semiconductor device 5110. Second semiconductor structure 5110 has a sixth package pitch and is electrically coupled to a second portion of the second surface of second interconnect structure 1110 through interconnect structures 5121-5121'''''''.

In one aspect of the concepts, systems, circuits and techniques sought to be protected herein, the interconnect structures disclosed herein are capable of providing for a variety semiconductor structures having a variety of pitches on a same package level of a multi-layer semiconductor device. Such approaches open up new direction for miniaturization. The use of different size interconnects, for example, allows for the integration of old, existing and new generation semiconductor structures on a same package level of a multi-layer semiconductor device. The interconnect structures, which may be provided on a plurality of package levels of the multi-layer semiconductor device, may be fabricated in a wide variety of manners and include a wide variety of materials, as will become further apparent from the figures below.

As a few examples, the interconnect structures may be fabricated as follows: Option 1: the interconnect structures may be provided from Sn—In, In, Sn—Bi, Sn—Pb; Option 2: the interconnect structures may be provided as Solder coated bumps, micro-bumps, and/or micro-pillars where micro bump/ micro pillars react with solder during reflow and/or melting to create an electrical connection and at least part of a low temperature melt solder is converted to high temperature melt solid solution. The interconnect structures may also be fabricated as follows: Option 3: using a high temperature melt spacer with minimum solder where spacer will prevent solder spreading during multi-layer assembly (eutectic tin-lead solder with 90/10 Pb—Sn spacer); and Option 4: using a high melt solder on one side of the interconnect structure and a low melt solder on another side of the interconnect structure. The low melt solder may melt and react with the high melt solder to create an intermetallic structure at the low melt-high melt solder interface (e.g., tin-lead solder and tin-bismuth solder). The interconnect structures may further be fabricated as follows: Option 5: the interconnect structures may be provided as a combination of solder bump, micro bump, micro pillar and conducting paste; Option 6: the interconnect structures may be provided as a NCP with a solder coated micro bump. An anisotropic conductive adhesive may be applied, for example, to achieve a finer pitch interconnect structure.

Figure 2:
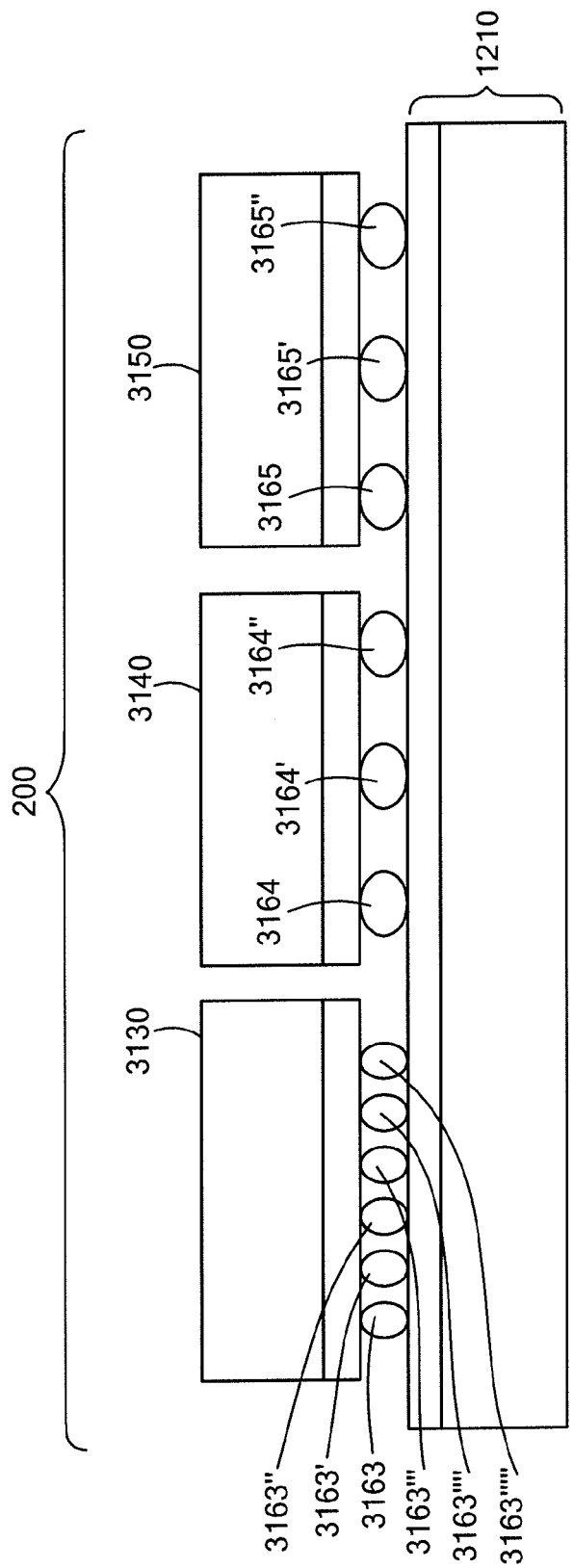
FIGS. 2-2B are block diagrams of example multi-layer semiconductor devices fabricated using a combination of interconnect structures.

The interconnect structures may also be fabricated as follows: Option 7: Control temperature bonding may be used for multi-level packaging or bonding of a multi-layer semiconductor device. FIGS. 1-2B, for example, shows various semiconductor devices having multi-level micro bump bonding. First level packaging or bonding (i.e., bonding of a first package level of a semiconductor device) can use a high temperature bump bonding cycle. Additionally, second level bonding can use lower temperature than first level bonding. Similarly third level bonding can use a lower temperature bonding than the second level bonding. In one embodiment, the first level bonding will experience three bonding cycles. In this embodiment, since second and third level bonding temperatures are lower than a first level bonding temperature, interconnects of the first level bonding will not melt during second and third level bonding.

Example interconnects in these semiconductor devices, which may be provided in one or more portions (e.g., two or more portions), may include one or more of the following materials and be bonded at one or more of the following temperature ranges. Sn—Ag or Cu-to-Cu or Cu/Ni/Sn/2.5Ag or Au-to-Au can be used as first level bonding in the temperature range around 250-300 C, tin-silver-copper can be used as second level bonding with temperature range around 225 C-245 C, tin-lead can be used as third level of bonding with temperature range around 190 C-220 C. Additionally, Indium can be used as a forth level of bonding with temperature range around 160-175 C, indium-tin can be fifth level of bonding with temperature range 125-145 C. For three level packaging of a semiconductor device, for example, in one embodiment it is possible to use: Sn—Ag and/or Cu-to-Cu and/or Cu/Ni/Sn2.5Ag and/or Au-to-Au as first level bonding, tin-lead as second level bond and Indium third level bonding. Alternatively, it is possible to use single or multiple microbumps which can use thermocompression bonding below its melt temperature and subsequent reflow and/or heat-treatment at an end of a bonding cycle to melt the interconnect(s) for creating reliable bonding as well as cure a polymer which may exist around the interconnect(s).

Referring now to FIG. 2, another example multi-layer semiconductor device 200 in accordance with the concepts, systems, circuits, and techniques sought to be protected herein is shown. Semiconductor device 200 includes a first semiconductor structure 210, semiconductor structure 3130 (here, a second semiconductor structure 3130), semiconductor structure 3140 (here, a third semiconductor structure 3140) and semiconductor structure 3150 (here, a fourth semiconductor structure 3150).

Second semiconductor structure 3130 has a second package pitch and is electrically and mechanically coupled to a first portion of a second surface of first semiconductor structure 210 (e.g., a CPU IC) through interconnect structures 3163, 3163', 3163'', 3163''', 3163'''', 3163'''''. Additionally, third semiconductor structure 3140 has a third package pitch and is electrically and mechanically coupled to a second portion of the second surface of first semiconductor structure 210 through interconnect structures 3164, 3164', 3164''. Further, fourth semiconductor structure 3150 has a fourth package pitch and is electrically and mechanically coupled to a third portion of the second surface of first semiconductor structure 210 through interconnect structures 3165, 3165', 3165''.

An example process for creating interconnect structures (e.g., 3163, 3164, 3165) is described below. It should, of course, be appreciate that in some embodiments the process need not be performed in the sequence described below. Evaporate and sputter 100-250 nm metal (e.g., Al, Nb, Cu) on a Si based device wafer. Coat wafer with photoresist (e.g., AZ1512 resist spin coated at 4000 rpm to make 1.2 um resist). Bake sample on standard hotplate (105 C/2 mints). Pattern resist on the contact aligner. Develop photoresist using developer CD26 for 30-40 S. Bake the wafer at about 100-125 C for about two minutes. Etch metal using wet and or dry etch. Strip resist with acetone will create patterned device with metal pad. Coat wafer again with photoresist for putting under bump metal on top of metal pad. Example: AZ1512 resist spin coated at 4000 rpm to make 1.2 um resist. Bake sample on standard hotplate (105 C/2 mints). Pattern resist on the contact aligner. Develop photoresist using developer CD26 for 30-40 S to create opening for UBM. Bake wafer at 100 C for one minute.

The process may additionally or alternatively include the following. Use Oxygen plasma (2-5 minutes) to remove organics and contaminates. Additional ion milling for 2-20 minutes under vacuum were used to remove metal oxide from pad materials and subsequently evaporate UBM (e.g., 20 nmTi/40 nm Pt/120 nm Au) to the opening and complete liftoff by stripping resist in hot (40 C) acetone. Alternatively, wet process can be used to deposit UBM using wet chemical approach. In one example, chemical etching oxide and subsequent electrodeless plating of Ni and Immersion Au process to create UBM. We prefer to use oxygen plasma for about 2-5 minutes and use Silane based (HMDS) paddle (e.g., 15 Second stay and 15 second spin) for surface treatment before putting resist for micro bumps or micro pillars. Coat wafer with photoresist on. In a typical process, we prefer to use Futurrex NR9-8000 spin 3000RM/30 S for 8 um thick resist. Bake wafer at 150 C/2 mints. Pattern resist on the contact aligner. Post expose bake for 100 C/1 mints. Develop photoresist in a developer RD6 for about 60 S for 8-10 micron resist. Sometimes additional baking 70-100 C after developing used to make the liftoff process more reproducible.

The process may additionally or alternatively include the following. Use Oxygen plasma (2-5 minutes) to remove organics and contaminates. Additional ion milling for 2-20 minutes under vacuum can be used to remove metal oxide from pad materials and subsequently evaporate single or multiple metal based micro bump (e.g., Cu, Indium coated Cu or Ag, Sn coated Cu or Ag, Au—Sn—Cu, In—Sn—Cu, In—Sn—Au—Pt—Ti—Cu) to the opening and complete liftoff by stripping resist in acetone. Alternatively, AZ1512 resist can be used for micro bump for plating process. For electroplating, it is necessary to deposit continuous thin metal layer before putting resist and flash etch the thin metal layer after microbump plating and resist striping. There are several options to create various bump and or pad pitch in the same layer. It is possible to create multiple size microbumps. We prefer to use in the range 6-8 micron resist to create 4-5 um opening as well as 15-20 um opening. In general, 6-8 micron resist (e.g., Futurrex NR9-8000) will have large processing window for 15-20 micron opening features. For example, 6-8 micron resist can be exposed in the range of 100-200 mJ/cm$^2$ to create 15-20 micron features. The bottom resist opening will increase with decreasing expose energy without significant changing top opening which typically controls the microbump size. 5 micron feature preferred low expose energy in the range of 100-130 mJ/cm$^2$ to create appropriate opening for 5 micron features.

The process may additionally or alternatively include the following. Spin coat resist thinner to be smaller than smallest feature. For 5 micron feature, 3-5 micron resist thickness will easily open all the feature size is around or more than 5 um diameter. In this case, we preferred to deposit more bump material than the resist thickness and successfully liftoff to create taller microbump than initial resist thickness. Example: Around 10 micron Futurrex NR9-8000 resist with expose energy around 240 mJ/cm$^2$ used to create 15 micron diameter features capable of creating 15 micron tall bump. Electroplating using resist can make taller bump but plating above resist create larger bump (mushroom effect) which will make difficult to maintain smaller pitch. Third option is to us multiple microbumps for larger feature. For example, single 15 um bump for 15 um pad, 5-9 micro bumps of a same size for 100 micron pad. Forth option is to use laser ablation to create different pitched microbumps. Laser ablation will remove resist materials and stop at the pad. For laser ablation, it is preferred to have thicker metal pad (e.g., 1 um or more).

Figure 2A:
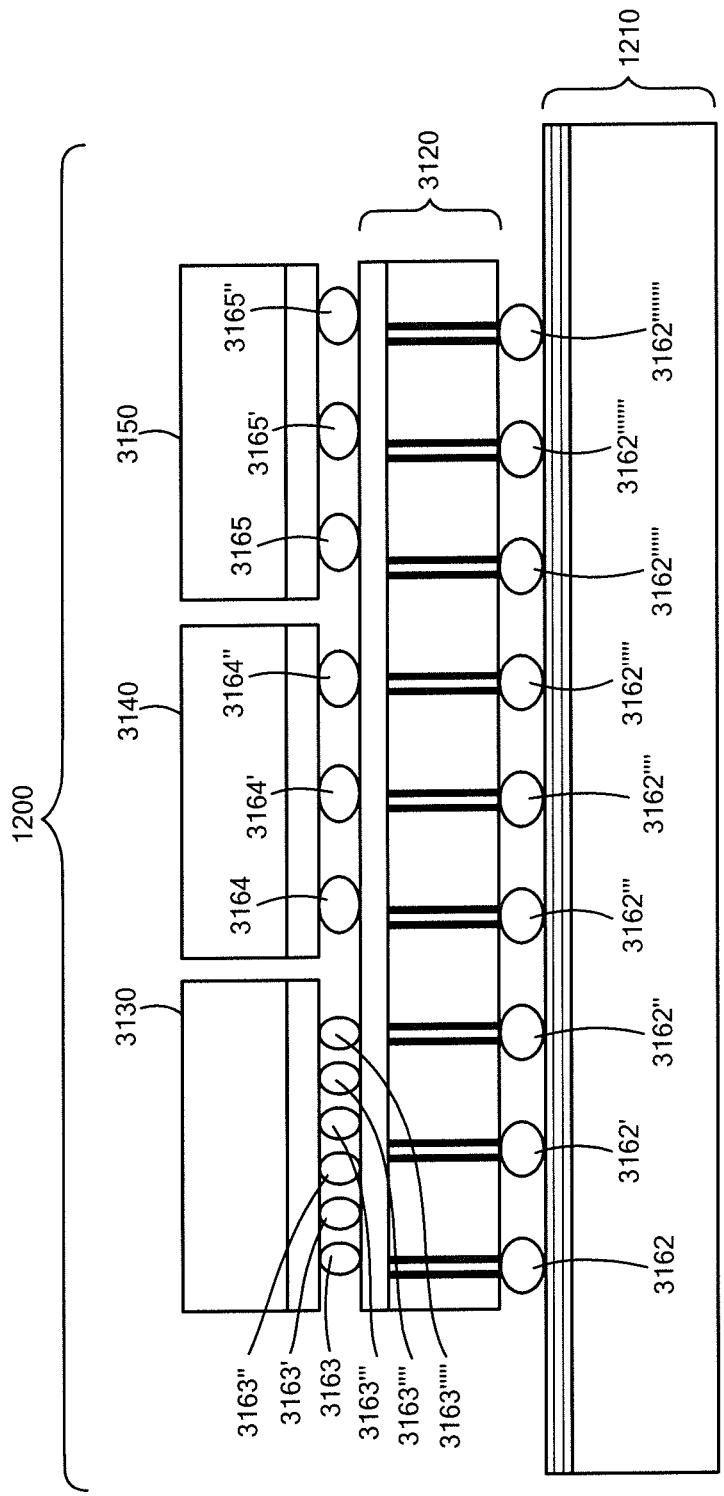
Figure 2B:
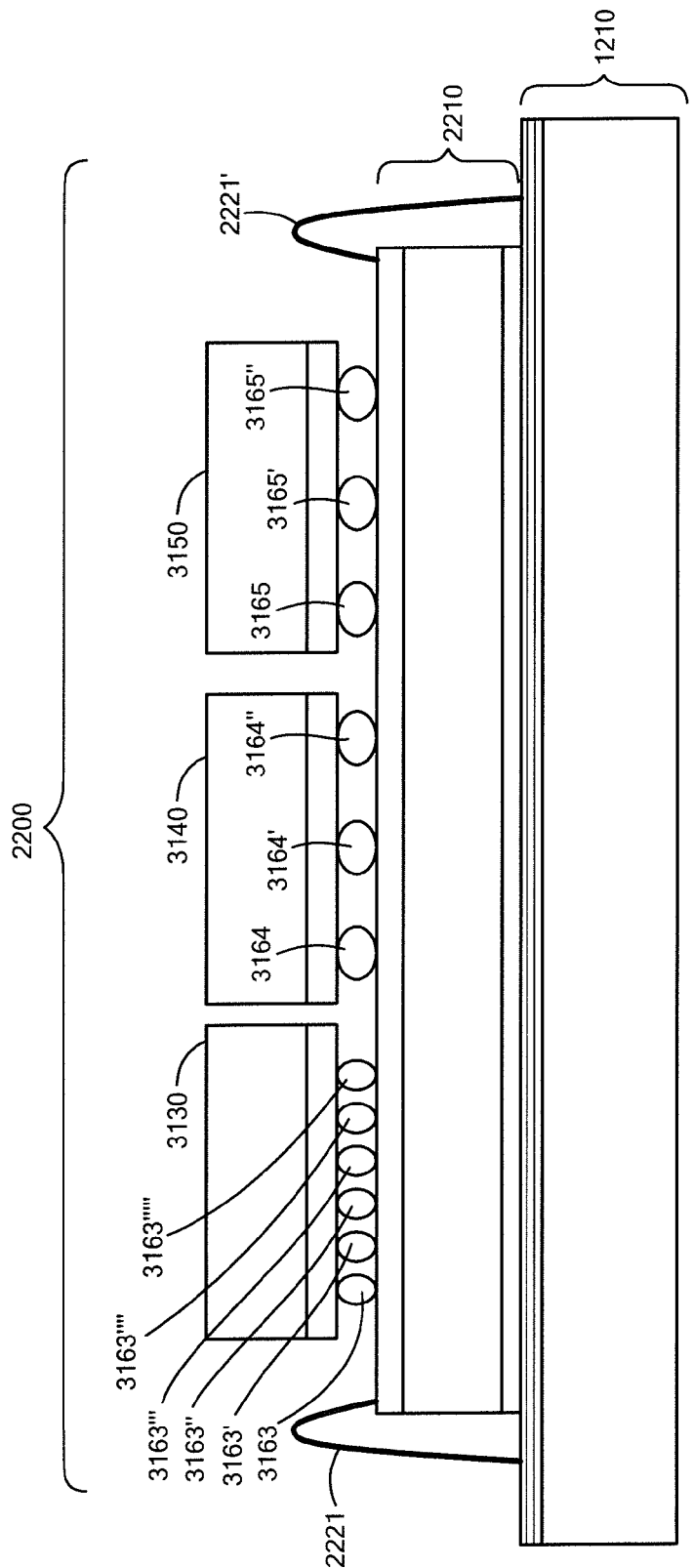

Referring now to FIG. 2A, in which like elements of FIG. 2 are provided having like reference designations, an example multi-layer semiconductor device 1200 includes a first semiconductor structure 1210 and semiconductor structure 3120 (here, a second semiconductor structure 3120). Semiconductor device 1200 also includes semiconductor structure 3130 (here, a third semiconductor structure 3130), semiconductor structure 3140 (here, a fourth semiconductor structure 3140), and semiconductor structure 3150 (here, a fifth semiconductor structure 3150).

Second semiconductor structure 3130 has a second package pitch and is electrically and mechanically coupled to a second surface of first semiconductor structure 1210 (e.g., an MCM) through interconnect structures 3162-3162'. Additionally, third semiconductor structure 3130 has a third package pitch and is electrically and mechanically coupled to a first portion of a second surface of second semiconductor structure 3120 through interconnect structures 3163, 3163', 3163", 3163''', 3163'''', 3163'''''.

Fourth semiconductor structure 3140 has a fourth package pitch and is electrically and mechanically coupled to a second portion of the second surface of second semiconductor structure 3120 through interconnect structures 3164, 3164', 3164". Further, fifth semiconductor structure 3150 has a fifth package pitch and is electrically and mechanically coupled to a third portion of the second surface of second semiconductor structure 3120 through interconnect structures 3165, 3165', 3165".

Referring now to FIG. 2B, another example multi-layer semiconductor device 2200 includes first semiconductor structure 1210 and a second semiconductor structure 2210. Semiconductor device 2200 also includes third semiconductor structure 3130, fourth semiconductor structure 3140 and fifth semiconductor structure 3150.

Second semiconductor structure 2210 has a second package pitch and is electrically and mechanically coupled to a second surface of first semiconductor structure 1210 through a plurality of wire bonding structures (here, wire bonding structures 2221, 2221'). Wire bonding structures 2221, 2221' form a corresponding plurality of electrical connections (here, first and second electrical connections) between first semiconductor structure 1210 and second semiconductor structure 2210.

Third semiconductor structure 3130 has a third package pitch and is electrically and mechanically coupled to a first portion of a second surface of second semiconductor structure 2210 through interconnect structures 3163, 3163', 3163", 3163''', 3163'''', 3163'''''. Additionally, fourth semiconductor structure 3140 has a fourth package pitch and is electrically and mechanically coupled to a second portion of the second surface of second semiconductor structure 2210 through interconnect structures 3164, 3164', 3164". Further, fifth semiconductor structure 3150 has a fifth package pitch and is electrically and mechanically coupled to a third portion of the second surface of second semiconductor structure 2210 through interconnect structures 3165, 3165', 3165".

In one aspect of the concepts, systems, circuits and techniques sought to be protected herein, the multi-layer semiconductor structures and interconnect structures illustrated in FIGS. 1-2B represent various integrated approaches to developing flip-chip interconnects for 3D constructions on various stacked die and/or MCM and or/SOC and/or multi-die system on chip (SoC) package configurations. The approaches may, for example, be found suitable for high-end, expensive electronics where part of the package, if necessary, can be replaced or repaired, or even upgraded without compromising overall electrical performance. The multi-layer semiconductor devices and interconnect structures discloses herein may be attractive for a range commercial applications (e.g., mixed digital-RF-microwave systems, systems seeking to integrate noisy digital circuits with RF/Analog circuits). Additional applications include computational systems, RF systems seeking 3DIC and SoP integration, and software-defined radios (SDRs). The multi-layer semiconductor device and interconnect structures disclosed herein may also provide for integration of heterogeneous technologies and components on a same SoC platform, as will become further apparent from the figures below.

Figure 3:
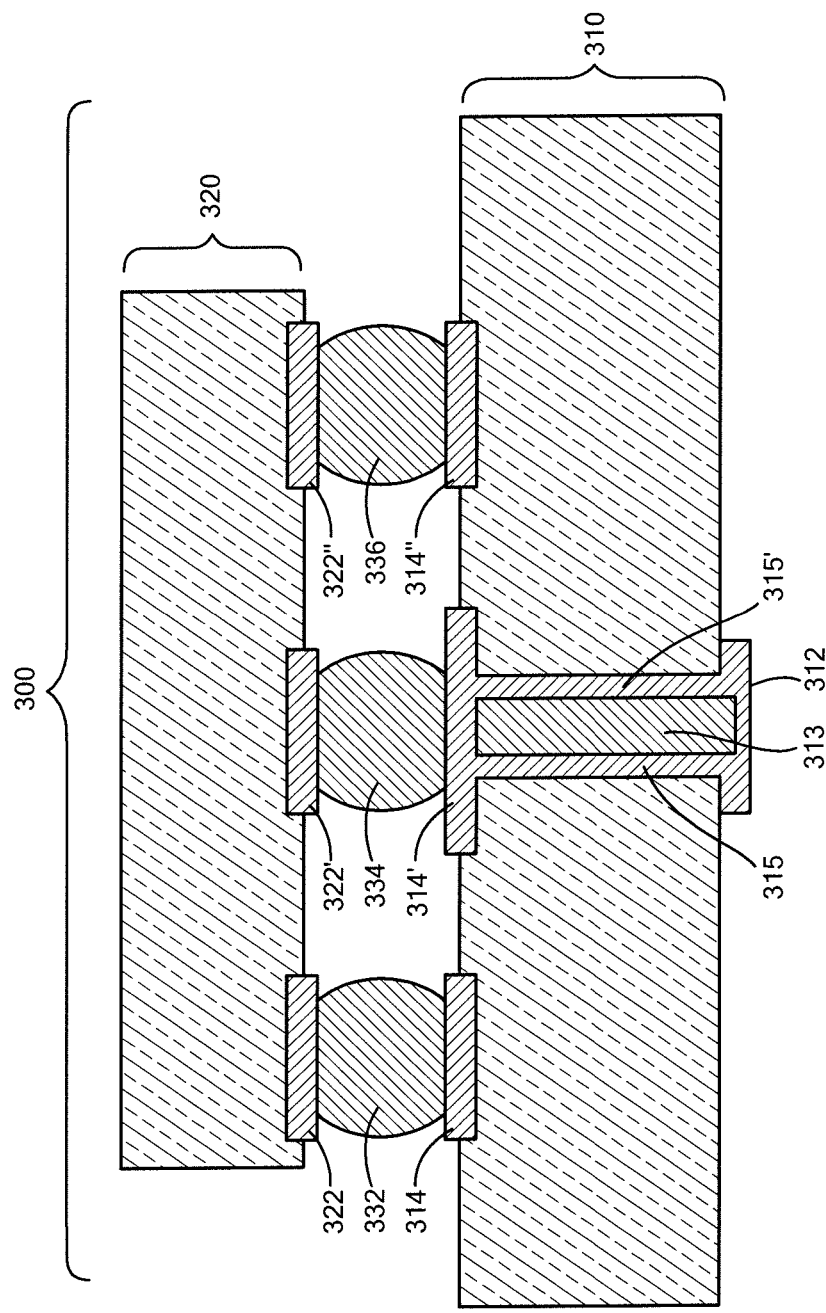
FIGS. 3-3B are block diagrams of example interconnect structures and example semiconductor structures as may be provided in a multi-layer semiconductor device fabricated using a combination of interconnect structures.

Referring now to FIG. 3, cross-sections of example semiconductor structures (here, semiconductor structures 310, 320) and example interconnect structures (here, interconnect structures 332, 334, 336) as may be provided in a multi-layer semiconductor device fabricated using a combination of interconnect structures (e.g., semiconductor device 100 of FIG. 1) is shown. First semiconductor structure 310 (e.g., an MCM which is part of a multi-die SoC with an active device (e.g. CPU, SRAM, power management, USB controller, FPGA, memory), or a through silicon via (TSV) substrate) has first and second opposing surfaces and includes interconnect pads 312, 314, 314', 314" which also have first and second opposing surfaces. The first surface of first interconnect pad 312 is disposed over or beneath a select portion of the first surface of first semiconductor structure 310. Additionally, the first surface of each of interconnect pads 314, 314', 314" is disposed over or beneath select portions of the second surface of first semiconductor structure 310.

First semiconductor structure 310 also includes a first pad interconnect 315 which extends from a first select portion of the first surface of interconnect pad 312 to a first select portion of interconnect pad 314', and second pad interconnect 315' which extends from a second select portion of the first surface of interconnect pad 312 to a second select portion of interconnect pad 314'. First semiconductor structure 310 additionally includes a through silicon via (TSV) structure 313 which is disposed in a cavity formed between the first and second pad interconnects 315, 315'. TSV structure 313 is electrically coupled to the first surfaces of each of interconnect pads 312, 314'.

Second semiconductor structure 320 (e.g., a 2D or 3D IC structure) has first and second opposing surfaces and includes interconnect pads 322, 322', 322" which also have first and second opposing surfaces. The first surface of each of interconnect pads 322, 322', 322" is disposed over or beneath select portions of the first surface of second semiconductor structure 320. In one embodiment, the interconnect pads 322, 322', 322" are each provided from or include Aluminum (Al) and/or copper doped Al and/or an under bump material.

Interconnect structures 332, 334, 336 (e.g., Cu or Au solder balls) each have first and second opposing portions. A first one of the interconnect structures 332, which is also sometimes referred to herein as a "first interconnect structure" 332, has a first portion coupled to the second surface of interconnect pad 314 of first semiconductor structure 310 and a second opposing portion coupled to the second surface of interconnect pad 322 of second semiconductor structure 320. Additionally, a second one of the interconnect structures 334, which is also sometimes referred to herein as a "second interconnect structure" 334, has a first portion coupled to the second surface of interconnect pad 314' of first semiconductor structure 310 and a second opposing portion coupled to the second surface of interconnect pad 322' of second semiconductor structure 320. Further, a third one of the interconnect structures 336, which is also sometimes referred to herein as a "third interconnect structure" 336, has a first portion coupled to the second surface of interconnect pad 314" of first semiconductor structure 310 and a second opposing portion coupled to the second surface of interconnect pad 322" of second semiconductor structure 320.

In the illustrated embodiment, second interconnect structure 334 (e.g., an Indium (In) micro-bump, a Tin-lead microbump, and/or SAC bump) is provided as an interconnect for electrically and mechanically coupling the second semiconductor structure 320 to the first semiconductor structure 310 Second interconnect structure 334 may melt and react with a UBM to produce a reliable interconnect with substantially no interface issues at a relatively low temperature (e.g., about 250 C) and, thus, creates a high performance interconnect. Additionally, second interconnect structure 334 may create a low resistance interconnect between the first and second semiconductor structures 310, 320 (e.g., due to the Indium material).

Additionally, in the illustrated embodiment first interconnect structure 332 and third interconnect structure 336 (e.g., gold (Au) or copper (Cu) micro-bumps) are each provided as so-called "interconnect spacers." The interconnect spacers may, for example, mechanically couple the second semiconductor structure 320 to the first semiconductor structure 310 and provide for efficient heat dissipation between the first and second semiconductor structures 310, 320 during system operation (e.g., The Au and Cu materials which the interconnect structures may be provided from are efficient at low and high temperatures and at wide temperature ranges, and can provide for efficient heat dissipation). The interconnect spacers may also control pitch between the first surface of second semiconductor structure 320 and the second surface of first semiconductor structure 310. The interconnect spacers may further control a height (e.g., a distance between first and second opposing portions) of the second interconnect structure 334 (e.g., an Indium (In) micro-bump) during flip-chip bonding of second semiconductor structure 320 to first semiconductor structure 310. The interconnect spacers may also keep a corresponding semiconductor structure (e.g., second semiconductor structure 320) away from "lossy" Silicon (Si).

It should, of course, be appreciated that in other embodiments at least one of interconnect structures 332, 336 is provided as an interconnect structure for electrically and mechanically coupling the second semiconductor structure 320 to the first semiconductor structure 310. Additionally, in other embodiments interconnect structure 334 may be provided as an interconnect spacer as described above.

Further, in one embodiment, first interconnect structure 332 and third interconnect 336 are each coupled to or provided as part of second semiconductor structure 320, and second interconnect structure 334 is coupled to or provided as part of first semiconductor structure 310. A height of second interconnect structure 334 (i.e., a distance between first and second opposing portions in the illustrated embodiment) may be larger than a corresponding height of first interconnect structure 332 and third interconnect structure 336 prior to bonding. Additionally, in one embodiment, first interconnect structure 332 and third interconnect structure 336 are each provided as solder coated bumps.

Figure 3A:
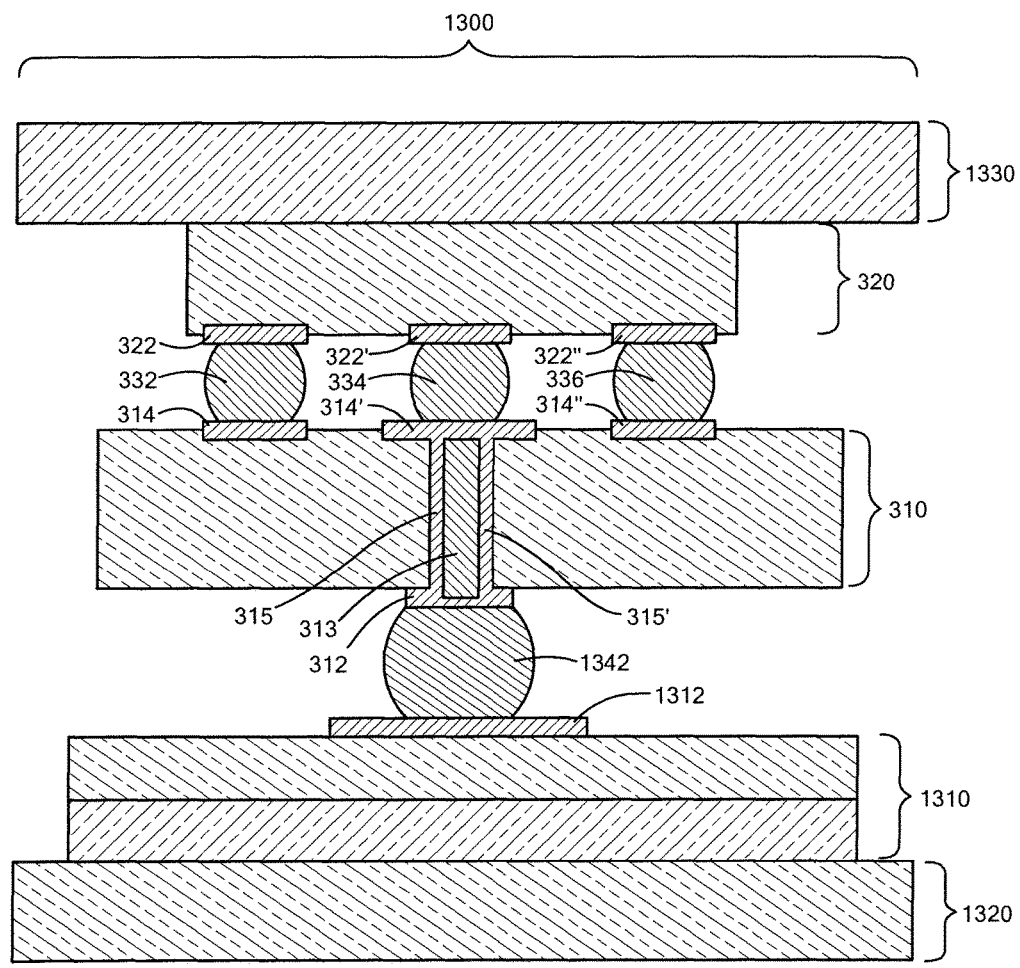

Referring now to FIG. 3A, in which like elements of FIG. 3 are provided having like reference designations, an example multi-layer semiconductor device 1300 includes first semiconductor structure 310 and second semiconductor structure 320. Semiconductor device 1300 also includes first interconnect structure 332, second interconnect structure 334, and third interconnect structure 336.

In the illustrated embodiment, semiconductor device 1300 also includes a third semiconductor structure 1310, a first heat dissipation structure 1320, a second heat dissipation structure 1330, and a fourth interconnect structure 1342. Third semiconductor structure 1310 (e.g., an MCM) has first and second opposing surfaces and includes an interconnect pad 1312. Interconnect pad 1312, which may be the same as or similar to interconnect pad 322 of second semiconductor structure 320, for example (e.g., including Cu, or Cu/Ni/Au), has a first surface which is disposed over or beneath the second surface of third semiconductor structure 1310. The first surface of interconnect pad 1312 may be electrically coupled to select electrical connections in the third semiconductor structure 1310.

Fourth interconnect structure 1342 (e.g., an Indium (In) micro-bump), which may be the same as or similar to second interconnect structure 334, for example, is disposed between the first surface of first semiconductor structure 310 and the second surface of third semiconductor structure 1310. Fourth interconnect structure 1342 is also electrically coupled to the second surface of interconnect pad 312 of first semiconductor structure 310, and to the second surface of interconnect pad 1312 of third semiconductor structure 1310.

First heat dissipation structure 1320 (e.g., a heat sink device or cold pate) has a surface (e.g., a second surface) which is disposed beneath and thermally coupled to the first surface of third semiconductor structure 1310. In one embodiment, the second surface of first heat dissipation structure 1320 is directly coupled to the first surface of third semiconductor structure 1310 (e.g., for efficient heat dissipation).

Additionally, in one embodiment, a thermal interface structure (not shown) and/or thermal interface materials (e.g., Indium (In) preform) (not shown) may be disposed between the second surface of first heat dissipation structure 1320 and the first surface of third semiconductor structure 1310. The thermal interface structures and/or thermal interface materials may, for example, provide mechanical strength to the bond(s) formed between the first heat dissipation structure 1320 and the third semiconductor structure 1310 (i.e., resulting from the coupling). The thermal interface structures and/or thermal interface materials may also reduce air gaps or spaces which may form between the first heat dissipation structure 1320 and the third semiconductor structure 1310.

Additionally, in some embodiments a thermally conductive adhesive material (e.g., a Nickel (Ni) or Gold (Au) adhesive material) (not shown) is disposed between the second surface of first heat dissipation structure 1320 and the first surface of third semiconductor structure 1310. Such may, for example, provide for increased heat dissipation between the third semiconductor structure 1310 and the first heat dissipation structure 1320.

Second heat dissipation structure 1330, which may be the same as or similar to first heat dissipation structure 1320, has a surface (e.g., a first surface) which is disposed over and thermally coupled to the second surface of second semiconductor structure 320. Additionally, similar to first heat dissipation structure 1320, in one embodiment the second surface of second heat dissipation structure 1330 is directly coupled to the second surface of second semiconductor structure 320 (e.g., for efficient heat dissipation). Second heat dissipation structure 1330 may, for example, remove heat from each of the first semiconductor structure 310 and the second semiconductor structure 320 during system operation (e.g., to minimize noise and increase performance of the first semiconductor structure 310 and the second semiconductor structure 320).

In one embodiment, third semiconductor structure 1310 further includes interconnect one or more additional interconnect structures which may be the same as or similar to interconnect structures 332, 336 for better heat dissipation. Additionally, in one embodiment first semiconductor structure 310 can be provided as an organic laminate chip carrier, and third semiconductor structure 1310 can be provided as an organic printed circuit board (PCB). Examples of organic materials suitable for use in such structures include fiberglass-reinforced or non-reinforced epoxy resins (sometimes referred to simply as FR4 material, meaning its Flame Retardant rating), poly-tetrafluoroethylene (Teflon), polyimides, polyamides, cyanate resins, photoimageable materials, and other like materials, or combinations thereof. Examples of electrically conductive materials for the circuit layers include copper or copper alloy. If the dielectric is a photoimageable material, it is photoimaged or photopatterned, and developed to reveal the desired circuit pattern, including the desired opening(s) as defined herein, if required. The dielectric material may be curtain coated or screen applied, or it may be supplied as a dry film or in other sheet form.

First semiconductor structure 310 and third semiconductor structure 1310 can each have one or more Cu filled through vias, stacked vias, and/or staggered vias with a minimum spacing of about seventy micron between vias. Such vias may, for example, further increase heat dissipation in semiconductor device 1300. As one example, heat may be dissipated from top and bottom portions of the semiconductor device 1300 through use of the vias, first and second heat dissipation structures 1320, 1330, and the interconnect structures of semiconductor device 1300.

Figure 3B:
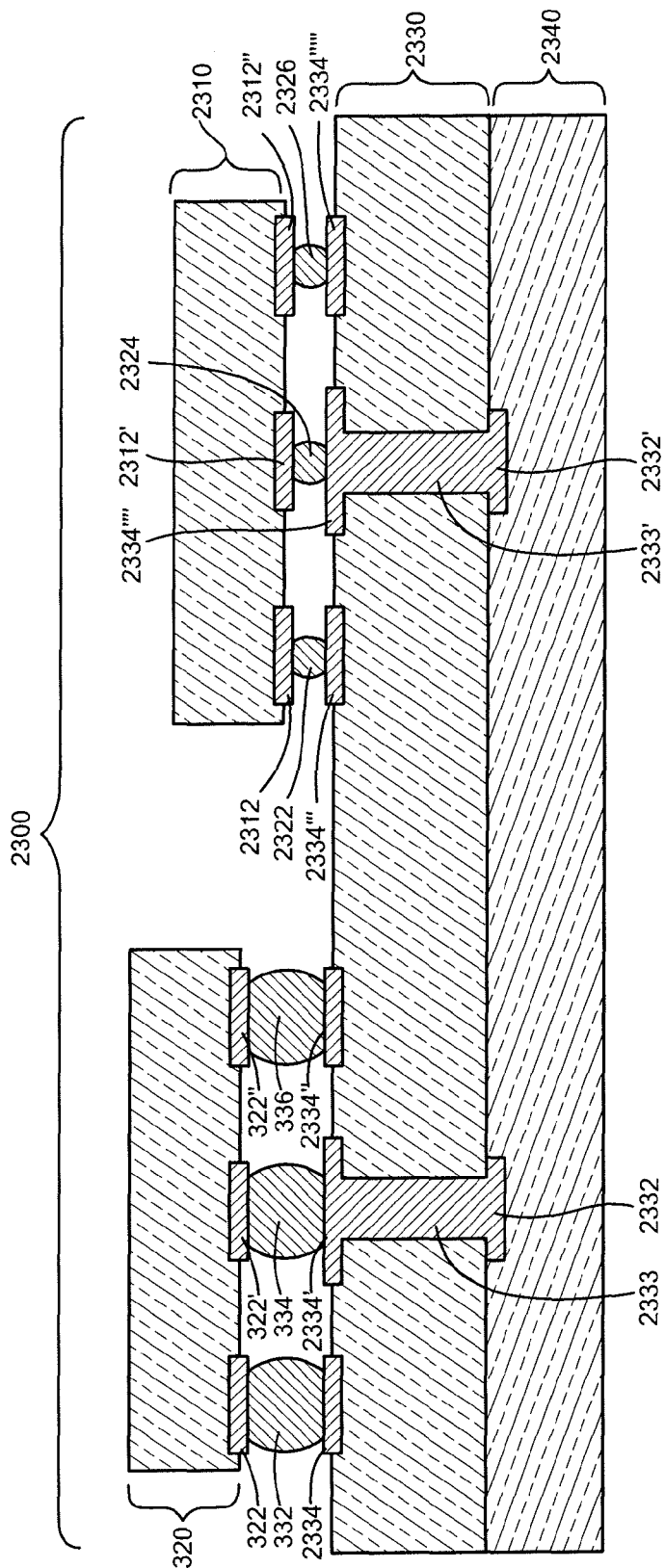

Referring now to FIG. 3B, another example multi-layer semiconductor device 2300 as may be provided in an example method for fabricating a multi-layer semiconductor device in accordance with the concepts, systems, circuits and techniques sought to be protected herein is shown. While the multi-layer semiconductor device 2300 is described as being fabricated in a sequence of processes, the example method is not limited to performing the processes in the sequence described.

Semiconductor device 2300 may be fabricated by providing semiconductor structure 320 (here, a first semiconductor structure 320) and a second semiconductor structure 2310. First semiconductor structure 320 has first and second opposing surfaces and includes interconnect pads 322, 322', 322", as described above in conjunction with FIG. 3. First semiconductor structure 320 also has a first package pitch. Second semiconductor structure 2310, which has a second, different package pitch, has first and second opposing surfaces and includes interconnect pads 2312, 2312', 2312". Interconnect pads 2312, 2312', 2312", which have first and second opposing surfaces, each have a first surface which is disposed over or beneath select portions of the first surface of second semiconductor structure 2310.

Semiconductor device 2300 may additionally be fabricated by providing interconnect structure 332 (here, a first interconnect structure 332), interconnect structure 336 (here, a second interconnect structure 336), a third interconnect structure 2322, and a fourth interconnect structure 2326. Each of interconnect structures 332, 336, 2322, 2326 have first and second opposing portions and are provided as interconnect spacers (e.g., Gold (Au) micro-bumps) in the illustrated embodiment. In one embodiment, first interconnect structure 332 and third interconnect structure 336 are provided as gold microbumps and/or solder coated gold microbumps. Additionally, in one embodiment second interconnect structure 334 can be solder, a solder coated microbump, and/or a solder coated micropillar. Further, in one embodiment third interconnect structure 2322 and fourth interconnect structure 2326 (and sixth interconnect structure 2324, as will be discussed) can have dimensions which are smaller than dimensions of second interconnect structure 334 as may be suitable for attaching to a smaller pitch semiconductor structure (e.g., 2310) in a same package level with a larger pitch semiconductor structure (e.g., 320).

The first portion of first interconnect structure 332 is disposed over and coupled to the second surface of interconnect pad 322 of first semiconductor 320. Additionally, the first portion of second interconnect structure 336 is disposed over and coupled to the second surface of interconnect pad 322" of first semiconductor 320. Additionally, the first portion of third interconnect structure 2322 is disposed over and coupled to the second surface of interconnect pad 2312 of second semiconductor 2310. Further, the first portion of fourth interconnect structure 2326 is disposed over and coupled to the second surface of interconnect pad 2312" of second semiconductor 2310.

In one embodiment, a distance between the first and second portions of each of the first and second interconnect structures 332, 336 is selected based upon the first package pitch of first semiconductor structure 320. This distance can be a predetermined distance of about twelve micrometers (μm), for example. Additionally, in one embodiment, a distance between the first and second portions of each of the third and fourth interconnect structure 2322, 2326 is selected based upon the second package pitch of second semiconductor structure 2310.

Semiconductor device 2300 may further be fabricated by substantially coining (or flatting) second portions of each of the first, second, third and fourth interconnect structures 332, 336, 2322, 2326 (i.e., portions distal to the second surface of interconnect pads 322, 322', 2312, 2312", respectively) through a "coining" process, for example. Such may provide for interconnect structures 332, 336, 2322, 2326 having a substantially flat, circular surface. In one embodiment, the portions which are substantially coined may be used to keep the height of interconnect structures 332, 336, 2322, 2326 uniform before bonding.

Semiconductor device 2300 may also be fabricated by providing a third semiconductor structure 2330 (e.g., an MCM or TSV substrate) having first and second opposing surfaces. Third semiconductor structure 2330 includes a first plurality of interconnect pads (here, interconnect pads 2332, 2332'), each having a first surface disposed over or beneath select portions of the first surface of third semiconductor structure 2330. Third semiconductor structure 2330 also includes a second plurality of interconnect pads (here, interconnect pads 2334, 2334', 2334", 2334''', 2334'''', 2334'''''), each having a first surface disposed over or beneath select portions of the second surface of third semiconductor structure 2330. Third semiconductor structure 2330 additionally includes a first through silicon via (TSV) structure 2333 which extends from and forms and electrical connection between the first surfaces of each of interconnect pads 2332, 2334'. Third semiconductor structure 2330 further includes a second TSV structure 2333' which extends from and forms and electrical connection between the first surfaces of each of interconnect pads 2332', 2334''''.

Semiconductor device 2300 may additionally be fabricated by providing interconnect structure 334 (here, a fifth interconnect structure 334) and a sixth interconnect structure 2324, each having first and second opposing portions. The first portion of fifth interconnect structure 334 (e.g., an Indium (In) micro-bump) is disposed over and coupled to the second surface of interconnect pad 2334' of third semiconductor structure 2330. In one embodiment, thermocompression bonding is used for the coupling here. Interconnect structure 332 and interconnect structure 336 may, for example, be deposited on semiconductor structure 320 and coined to specify spacing range. Additionally, interconnect structures 332, 2322, 2324, and 2326 can be deposited on corresponding interconnects pads of semiconductor structure 2330 using photoresist. In one embodiment, the thickness of the photoresist is preferred to be less or equal to the smallest size (e.g., diameter) of interconnect structures 2322, 2324, and 2326.

In one embodiment, it is further possible to preapply uncured and/or partially cured adhesive on top of semiconductor structure 2330 prior to thermocompression bonding. Additionally, in one embodiment, the thermocompression bonding occurs below melt temperature. In embodiments in which a preapply adhesive is present, thermocompression bonding can occur at or below or above melt temperature. In one embodiment, it is preferred to couple the semiconductor structures one semiconductor structure at a time to maintain a different gap and pitch in a same package level. However, it is also possible to couple all semiconductor structures at substantially the same time and still can maintain a different gap and pitch in the same package level.

Additionally, during fabrication, the first portion of sixth interconnect structure (e.g., an Indium (In) micro-bump) 2324 is disposed over and coupled to the second surface of interconnect pad 2334"" of third semiconductor structure 2330. In one embodiment, a distance between the first and second portions of fifth interconnect structure 334 is selected based upon the first package pitch of first semiconductor structure 320. Additionally, in one embodiment, a distance between the first and second portions of sixth interconnect structure 2324 is selected based upon the second package pitch of second semiconductor structure 2310.

Semiconductor device 2300 may further be fabricated by aligning the first surface of first semiconductor structure 320 with the second surface of third semiconductor structure 2330, and electrically coupling the first semiconductor structure 320 to the third semiconductor structure 2330 using conventional flip-chip techniques, for example. The first surface of second semiconductor structure 2310 may also be aligned with and electrically coupled to the second surface of third semiconductor structure 2330 using flip-chip techniques.

Semiconductor device 2300 may also be fabricated by providing a fourth semiconductor structure 2340 (e.g., an interposer) which has first and second opposing surfaces. The second surface of fourth semiconductor structure 2340 may be aligned with and electrically coupled to the first surface of third semiconductor structure 2330 through thermocompression bonding techniques, for example.

In one aspect of the concepts, systems, circuits and techniques sought to be protected herein, FIG. 3B illustrates microbump technology capable of combining multiple chips into a single package by joining a variety of arbitrary structures to produce various shapes, sizes and pitches one a same package level. Here, microbump technology having first micro-bumps with controlled spacing (e.g., interconnect structures 332, 334, 336) are used for coupling at least one semiconductor structure (e.g., semiconductor structure 310) in semiconductor device 2300. Additionally, second microbumps (e.g., interconnect structures 2332, 2334, 2336) minimize spacing to provide for lower parasitic inductance for a second semiconductor structure in a same packaging layer of semiconductor device 2300.

Figure 4:
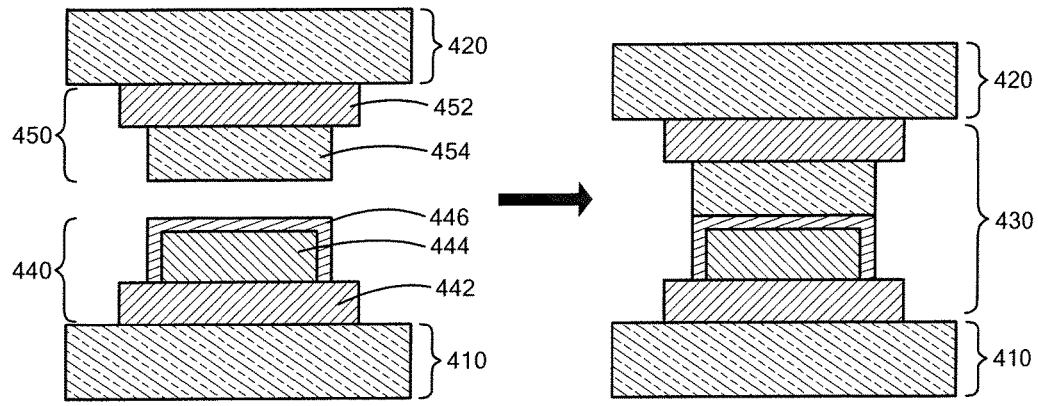
FIGS. 4-4B are block diagrams of example interconnect structures as may be provided in a multi-layer semiconductor device fabricated using a combination of interconnect structures.

Referring now to FIG. 4, cross-sections of example semiconductor structures (here, semiconductor structures 410, 420) and an example interconnect structure 430 as may be provided in a multi-layer semiconductor device fabricated using a combination of interconnect structures (e.g., semiconductor device 100, FIG. 1) is shown. Interconnect structure 430, which may serve as an interposer for electrically and mechanically coupling semiconductor structure 420 (e.g., an MCM) to semiconductor structure 410 (e.g., an interposer), for example, includes a first interconnect portion 440 and a second interconnect portion 450. The first interconnect portion 440 may be provided as part of or coupled to semiconductor structure 410. Additionally, the second interconnect portion 450 may be provided as part of or coupled to semiconductor structure 420.

First interconnect portion 440 includes an interconnect pad 442 (e.g., an Aluminum (Al) interconnect pad with a Gold (Au) surface finish) having first and second opposing surfaces. The interconnect pad 442 may, for example, be electrically coupled to one or more electrical connections in semiconductor structure 410. First interconnect portion 440 also includes a first conductive structure 444 (e.g., a metal conductive structure) having first and second opposing surfaces and one or more sides. The first surface of first conductive structure 444 is disposed over and coupled to the second surface of interconnect pad 442. Additionally, the second surface of first conductive structure 444 and select ones of the sides of first conductive structure 444 are coated with a low melt metal or alloy material (e.g., Indium, tin-indium, tin-bismuth, tin-lead) to produce a corresponding fusible coupling surface or structure 446 on the first conductive structure 444.

Second interconnect portion 450 includes an interconnect pad 452 having first and second opposing surfaces. The interconnect pad 452 may, for example, be electrically coupled to one or more electrical connections in semiconductor structure 420. Second interconnect portion 450 also includes a second conductive structure 454 (e.g., a solder ball, sphere, pillar, or micro-bump) having first and second opposing portions (here, first and second opposing surfaces) and one or more sides. The first surface of second conductive structure 454 is disposed over and coupled to the second surface of interconnect pad 452. First interconnect portion 440 and second interconnect portion 450 may be coupled together through a coupling process (e.g., a bonding or reflow process) to produce interconnect structure 430 (and electrically and mechanically couple the second semiconductor structure 420 to the first semiconductor structure 410).

During the coupling process, the fusible coupling surface 446 on the first conductive structure 444 may, for example, melt and form an electrical connection between the first conductive structure 444 and the second conductive structure 454. Additionally, during the coupling process at least part of the first surface of second conductive structure 454 may react with the second surface of interconnect pad 452 to create a low or high temperature melt interface (i.e., a melt surface) between second conductive structure 454 and interconnect pad 452. For example, when interconnect pad 452 is provided from Cu and second conductive structure 454 is provided from Tin, a high temperature melt interface may be created. Additionally, when interconnect pad 452 is provided from Tin and second conductive structure 454 is provided from Indium, a low temperature melt interface may be created. In one embodiment, the melt interface melts at a temperature which is lower than a melting temperature of the second conductive structure 454 (e.g., by creating a concentration gradient at the interface).

In one embodiment, the size and shape of at least one of the interconnect pad 442, the first conductive structure 444, the interconnect pad 452 and the second conductive structure 454 is selected to achieve a desired pitch (e.g., a pitch requirement of semiconductor structure 410 or semiconductor structure 420). Additionally, by controlling melt characteristics of the fusible coupling surface 446, for example, it is possible to create a finer pitch interconnect.

Additionally, in one embodiment, second interconnect portion 450 further includes an under-bump metallization (UBM) structure (not shown) for coupling second conductive structure 454 to interconnect pad 452. The UBM structure may, for example, be disposed between interconnect pad 452 and second conductive structure 454. In one embodiment, interconnect pad 452 is a metal interconnect pad (e.g., including Au and/or Cu), and the UBM structure is provided as part of or is disposed over the second surface of the interconnect pad 452. The UBM structure may be provided from one or more electrically conductive materials (e.g., Copper (Cu), Gold (Au), Nickel (Ni), Platinum (Pt), Tin (Sn), and Titanium (Ti)). Example combinations of conductive materials for the UBM structure include Ti—Pt—Au—Sn, Ti—Pt—Au—Sn—Au, Ni—Au—Sn, and Ni—Au—Sn—Au.

Further, in one embodiment, second conductive structure 454 includes one or more of the following materials or combinations of materials: tin-lead, bismuth-tin, bismuth-tin-iron, tin, indium, tin-indium, indium-gold, tin-indium-gold, tin-silver, tin-gold, indium, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof. Such materials and combinations of materials may, for example, melt during the coupling process.

Additionally, in one embodiment, fusible coupling surface 446 and second conductive structure 454 are each provided from a different metal or alloy material or combination of materials (i.e., interconnect structure 430 has a multiple melt composition). As one example, second conductive structure 454 may be provided from tin, and fusible coupling surface 446 may be provided from indium. In such example it is possible to create an indium and/or a tin-indium concentration gradient with tin from 45% to 100% at the coupling surface.

During coupling, a melt interface (i.e., a melt surface) formed between the fusible coupling surface 446 and second conductive structure 454 may, for example, melt at a first temperature while remaining portions of the fusible coupling surface 446 and second conductive structure 454 (and other portions of interconnect structure 430) may melt at a second, higher temperature. Such may, for example, provide for the ability to decouple and recouple the interconnect structure 430 if rework is required during assembly of the multi-layer semiconductor device including semiconductor structures 410, 420.

Figure 4A:
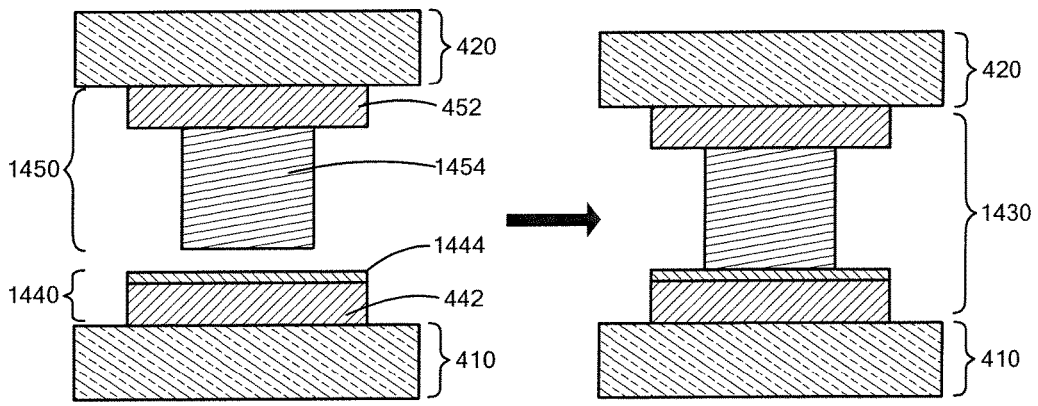

Referring now to FIG. 4A, in which like elements of FIG. 4 are provided having like reference designations, an example interconnect structure 1430 includes a first interconnect portion 1440 which may be provided as part of or coupled to semiconductor structure 410. Interconnect structure 1430 also includes a second interconnect portion 1450 which may be provided as part of or coupled to semiconductor structure 420.

First interconnect portion 1440 includes interconnect pad 442 which, similar to interconnect pad 442 of interconnect structure 430, may be electrically coupled to one or more electrical connections in semiconductor structure 410. The second surface of interconnect pad 442 is coated with a low melt metal or alloy material (e.g., a solder melt) to produce a corresponding fusible coupling surface or structure 1444 on interconnect pad 442. In one embodiment, fusible coupling surface 1444 and fusible coupling surface 446 are be similar, and second conductive structure 454 or second conductive structure 1454, as will be discussed, can be used as a second low melt element which can melt after fusible coupling surfaces 446, 1444 melt. In such embodiment, second conductive structure 454 or second conductive structure 1454 can be used to control a gap between semiconductor structure 420 and semiconductor structure 410.

Second interconnect portion 1450 includes interconnect pad 452 which, similar to interconnect pad 452 of interconnect structure 430, may be electrically coupled to one or more electrical connections in semiconductor structure 420. Second interconnect portion 1450 also includes a second conductive structure 1454 (e.g., a solder ball, sphere, pillar, or micro-bump) having first and second opposing portions (here, first and second opposing surfaces) and one or more sides. The first surface of second conductive structure 1454 is disposed over and coupled to the second surface of interconnect pad 1452.

First interconnect portion 1440 and second interconnect portion 1450 may be coupled together through a coupling process to produce interconnect structure 1430 (and electrically and mechanically couple second semiconductor structure 420 to first semiconductor structure 410). During the coupling process, the fusible coupling surface 1444 on interconnect pad 442 may, for example, melt and form an electrical connection between interconnect pad 442 and the second conductive structure 1454.

Figure 4B:
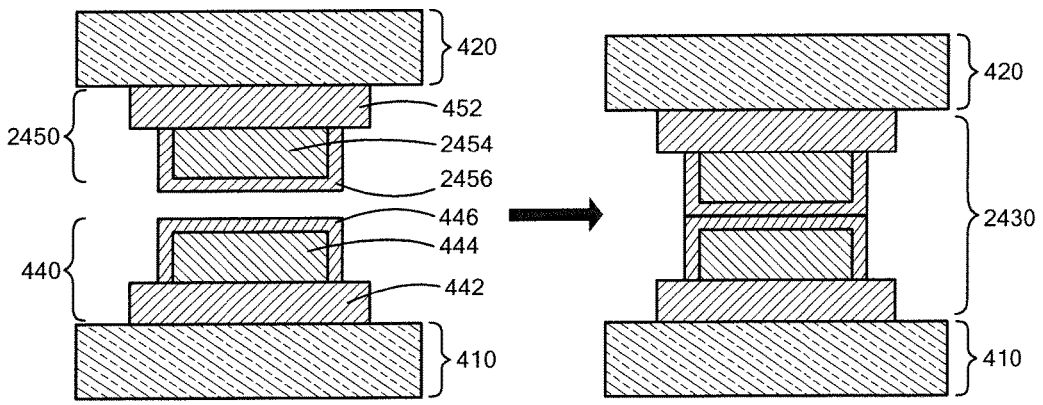

Referring now to FIG. 4B, another example interconnect structure 2430 as may be provided in a multi-layer semiconductor device fabricated using a combination of interconnect structures is shown. Interconnect structure 2430 includes first interconnect portion 440 which may be provided as part of or coupled to semiconductor structure 410. Interconnect structure 2430 also includes a second interconnect portion 2450 which may be provided as part of or coupled to semiconductor structure 420.

First interconnect portion 440 includes interconnect pad 442, first conductive structure 444 and fusible coupling surface 446. Second interconnect portion 1450 includes interconnect pad 452 which, similar to interconnect pad 452 of interconnect structure 430, may be electrically coupled to one or more electrical connections in semiconductor structure 420. Second interconnect portion 1450 also includes a second conductive structure 454 which may be the same as or similar to first conductive structure 444. Second conductive structure 454 has first and second opposing surfaces and one or more sides. The first surface of second conductive structure 2454 is disposed over and coupled to the second surface of interconnect pad 452. Additionally, the second surface of second conductive structure 2454 and select ones of the sides of second conductive structure 2454 are coated with a low melt metal or alloy material (e.g., Tin, Indium, Tin-lead, Tin-bismuth) to produce a corresponding fusible coupling surface 2456 on the second conductive structure 2454.

First interconnect portion 440 and second interconnect portion 2450 may be coupled together through a coupling process to produce interconnect structure 2430 (and electrically and mechanically couple the second semiconductor structure 420 to the first semiconductor structure 410). During the coupling process, the fusible coupling surface 446 on the first conductive structure 444 and the fusible coupling surface 2456 on the second conductive structure 2454 may, for example, melt and form an electrical connection between the first conductive structure 444 and the second conductive structure 2454.

In one embodiment, fusible coupling surface 446 and fusible coupling surface 2456 are each provided from a different metal or alloy material or combination of materials (e.g., Tin, Indium, Tin-lead, Tin-bismuth). Such may, for example, create a lower temperature melt interface between the first interconnect portion 440 and the second interconnect portion 2450 (and semiconductor structures 410, 420).

In one aspect of the concepts, systems, circuits and techniques sought to be protected herein, FIGS. 4-4B illustrate various possible interconnects. For example, an interconnect may consist of a bump and an under bump metallurgy (UBM) where the bump will react with at least part of the UBM at an interface to create lower temperature melt interface. In one embodiment, the interface melts at a lower temperature than the bump and the UBM. Additionally, in embodiment it is also possible to create a concentration gradient at the interface which melts at lower temperature than bump materials. Interconnects may have a multiple melt composition. Additionally, an interconnect interface may melt at lower temperature than other portions of the interconnect. This way it is possible to create an interconnect which will have opportunity to do double assembly for rework and if necessary to create more reliable interconnect. Example materials for the bump and UBM include Ti—Pt—Au—Sn, Ti—Pt—Au—Sn—Au, Ni—Au—Sn, and Ni—Au—Sn—Au.

Figure 5:
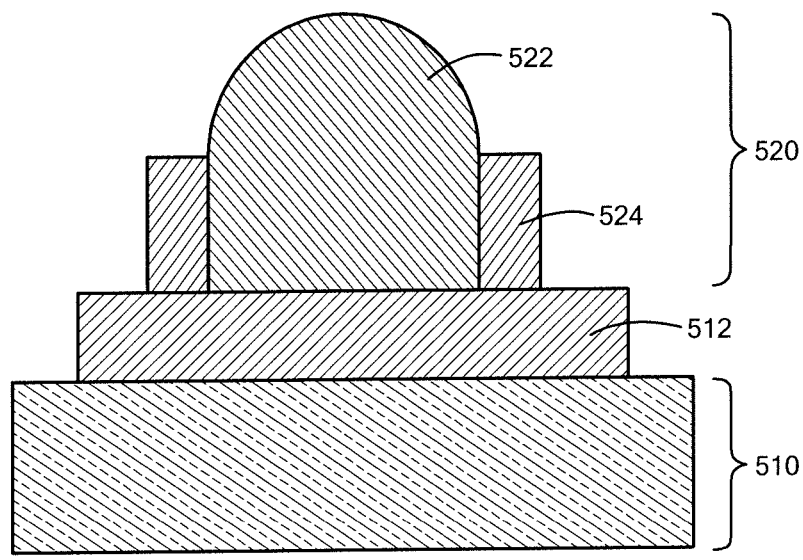
FIGS. 5-5A are block diagrams of example interconnect structures as may be provided in a multi-layer semiconductor device fabricated using a combination of interconnect structures.

Referring now to FIG. 5, cross-sections of an example semiconductor structure 510 and an example interconnect structure 520 as may be provided in a multi-layer semiconductor device fabricated using a combination of interconnect structures is shown. Semiconductor structure 510, which may be the same as or similar to one or more of the semiconductor structures described in conjunction with the above figures, has first and second opposing surfaces and a predetermined package pitch (e.g., a first package pitch). A first surface of an interconnect pad 512 is disposed over and coupled to the second surface of semiconductor structure 510 in the illustrated embodiment. The first surface of interconnect pad 512 may also be coupled to one or more electrical connections (not shown) in the semiconductor structure 510.

Interconnect structure 520, which may be provided as part of or coupled to the semiconductor structure 510, includes a conductive structure 522 and a barrier structure 524 (e.g., to reduce or eliminate melt flow of conductive structure 522 during reflow). The conductive structure 522 has first and second opposing portions and one or more edges spaced between the first and second portions. The first portion is disposed over and coupled to first select portions of a second opposing surface of interconnect pad 512. In the illustrated embodiment, the first portion is substantially flat and the second portion is substantially curved. However, other configurations of the first and second portions are of course possible.

The barrier structure 524, which may provide mechanical stability, long term reliability, and finer pitch capability to interconnect structure 520 (e.g., acting as fence to prevent/minimize X-Y flow of conductive structure 522 during bonding), for example, has first and surfaces and one or more sides. The first surface of barrier structure 524 is disposed over and coupled to second select portions of the second surface of interconnect pad 512. Additionally, the first surface of barrier structure 524 surrounds corresponding edges of the conductive structure 522 (e.g., to prevent X-Y shorts between conductive structure 522 and other conductive structures). The second surface of barrier structure 524 extends a predetermined distance from the second surface of interconnect pad 512.

In one embodiment, conductive structure 522 is provided from a material having a first surface energy (e.g., a first melt phase), and barrier structure 524 is provided from a material having a second, lower surface energy (e.g., a second, lower melt phase). In one embodiment, conductive structure 522 is provided from Indium and has a height of about eight micron, and barrier structure 524 can be provided from 20 nmAu/50 nmPt/20 nm Ti. Deposition of Ti/Pt/Au and Indium using a same or similar photoresist will favor these kinds of structures. Conductive structure 522 and barrier structure 524 may attach with each other by common materials. In the illustrated embodiment, for example, a gold layer is present between In and Pt.

Additionally, in one embodiment, the barrier structure 524 is provided from one or more polymer matrix composites (PMCs). Examples of polymer matrix composites suitable for use in such structures include photoimageable epoxy resins, polyamides, cyanate resins, photoimageable materials, and other like materials, or combinations thereof.

Generally there is substantially no gap between conductive structure 522 and barrier structure 524 when conductive structure 522 and barrier structure 524 are deposited together using a same or similar photoresist. However, it is possible to deposit conductive structure 522 and barrier structure 524 using separate photoresist processes. For separate photoresist processes, barrier structure 524 may have a preferred photoresist thickness of between about one micron and about two micron. Additionally, for separate photoresist processes, conductive structure 522 may have a preferred photoresist thickness of between about eight micron and about sixteen micron. For separate deposition of conductive structure 522 and barrier structure 524, a distance between about zero point five (0.5) micron and about twenty micron may exist between barrier structure 524 and corresponding edges of conductive structure.

In one embodiment, interconnect pad 512 is provided as part of semiconductor structure 510. Additionally, in one embodiment, interconnect pad 512 is provided as part of interconnect structure 520. Further, in one embodiment, interconnect structure 520 is provided as a select interconnect portion (e.g., a first or second interconnect portion) of an interconnect structure which includes two or more portions (not shown).

Figure 5A:
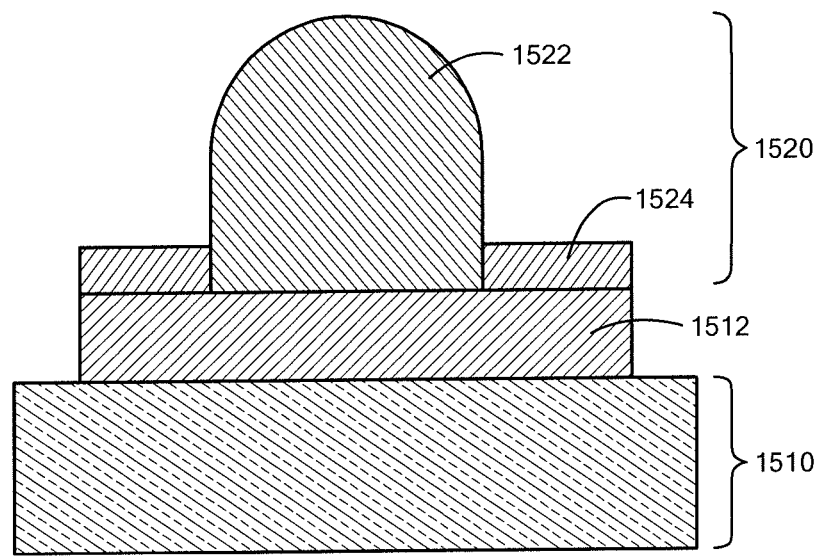

Referring now to FIG. 5A, another example semiconductor structure 1510 and example interconnect structure 1520 is shown. Semiconductor structure 1510 has first and second opposing surfaces and a predetermined package pitch. A first surface of an interconnect pad 1512, which may have dimensions selected based at least in part upon the predetermined package pitch and/or dimensions of the interconnect structure 1520, for example, is disposed over and coupled to the second surface of semiconductor structure 1510. The first surface of interconnect pad 1512 may also be coupled to one or more electrical connections (not shown) in the semiconductor structure 1510. In one embodiment, interconnect pad 1512 may be covered with a passivation layer having a thickness of between about one micron and about two micron. As one example, in an embodiment in which interconnect pad 1512 is provided having a diameter of about twenty micron, interconnect structure 1520 may have a diameter of between about sixteen micron and about eighteen micron and be deposited on a corresponding opening of interconnect pad 1512.

Interconnect structure 1520, which may be provided as part of or coupled to the semiconductor structure 1510, includes a conductive structure 1522 and a barrier structure 1524 which are similar to conductive structure 522 and barrier structure 524 of FIG. 5, respectively.

Here, however, the dimensions of conductive structure 1522 and barrier structure 1524 are each selected based at least in part upon the predetermined package pitch of semiconductor structure 1510 instead of the predetermined package pitch of semiconductor structure 510, for example. In one embodiment, barrier structure 1524 is provided from about 20 nm Ti and about 50 nm Pt, and deposited on interconnect pad 1512 (e.g., an Al interconnect pad). Additionally, in one embodiment, conductive structure 1522 is grown separately from barrier structure 1524 and interconnect pad 1512. Conductive structure 1522 may, for example, be provided from about 5-20 nm Ti, about 50-100 nm Au and about 5-20 micron In or another low melt metal and/or alloy.

In the illustrated embodiment, a first portion of conductive structure 1522 is disposed over and coupled to first select portions of the second surface of interconnect pad 1512. Additionally, a first surface of barrier structure 1524 is disposed over and coupled to second, remaining portions of the second surface of interconnect pad 1512. In one embodiment, barrier structure 1524 can be provided from Platinum or Nickel or Au/Pt/Ti or Au/Ni with a substantially random top surface. Additionally, in one embodiment, conductive structure 1522 can be provided from tin-lead, tin-silver-copper, or a solder coated Cu micro bump. Barrier structure 1524 can be directional, preventing flow of conductive structure in at least one direction. Additionally, barrier structure 1524 can have a height of between about 200 nm and a resist thickness used to create conductive structure 1522. It is further possible that barrier structure 1524 can be provided as part of interconnect pad 1512, a UBM disposed proximate to interconnect pad 512. Further, barrier structure 1524 may be located at an end (i.e., off center) of the interconnect pad 1512. In one embodiment in which interconnect pa 1512 is surrounded by passivation oxide or soldermask, barrier structure 1524 may be located at an opening of interconnect pad 1512 (e.g., an opening which is coupled to one or more electrical connections in a semiconductor structure).

Figure 6:
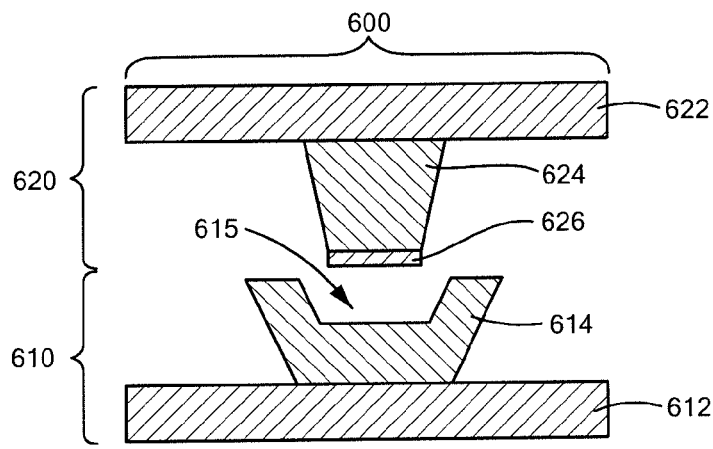
FIGS. 6-6B are block diagrams of example interconnect structures as may be provided in a multi-layer semiconductor device fabricated using a combination of interconnect structures.

Referring now to FIG. 6, a cross-section of another example interconnect structure 600 as may be provided in a multi-layer semiconductor device fabricated using a combination of interconnect structures is shown. Interconnect structure 600 includes a first interconnect portion 610 which may be provided as part of or coupled to a first semiconductor structure (not shown) of a multi-layer semiconductor device (not shown), for example. Interconnect structure 600 also includes a second interconnect portion 620 which may be provided as part of or coupled to a second semiconductor structure (not shown) of the multi-layer semiconductor device.

First interconnect portion 610 of interconnect structure 600 includes an interconnect pad 612 having first and second opposing surfaces. First interconnect portion 610 also includes a first conductive structure 614 (e.g., a UBM structure and/or a part of an interconnect structure provided from a metal or alloy material) which has a first portion (here, a first surface) disposed over and coupled to the second surface of interconnect pad 612. First conductive structure 614 also has a cavity 615 formed in a second opposing portion (here, a second opposing surface) of the first conductive structure 614. The cavity 615 may, for example, have a predetermined shape and extend a predetermined distance between the second portion of first conductive structure 614 and the first portion of first conductive structure 614. Although the second portion of the first conductive structure 614 is shown as having a substantially smooth surface in the illustrated embodiment, it is possible that one or more edges of the second portion of the first conductive structure 614 can have rough edges or edges with a non-uniform roughness.

In one embodiment, the predetermined shape is selected such that the cavity 615 is shaped to receive at least a select portion of another conductive structure (e.g., second conductive structure 624, as will be discussed). Additionally, in one embodiment, first conductive structure 614 and cavity 615 can have a same or similar composition a fusible coupling surface 626, as will be discussed. In general, first conductive structure 614 is prepared by creating a photoresist where a top opening of the photoresist is larger than a bottom opening of the photoresist. By depositing an interconnect material through the resist opening and subsequent photoresist liftoff, a first interconnect portion 610 having a first conductive structure 614 is created. Thickness of first conductive structure 614 may be different from top and bottom. In general, cavity 615 is thinner than the bulk of first conductive structure 614.

Second interconnect portion 620 of interconnect structure 600 includes an interconnect pad 622 having first and second opposing surfaces. Second interconnect portion 620 also includes a second conductive structure 624 (e.g., a micro-pillar bump) which has a first portion (here, a first surface) disposed over and coupled to the second surface of interconnect pad 622. A second opposing portion (here, a second opposing surface) of second conductive structure 624 is coated with a fusible conductive material (e.g., a solder melt material) to produce a fusible coupling surface 626 (e.g., a solder tip) on the second portion of second conductive structure 624. Fusible coupling surface 624 may, for example, melt and react with first conductive structure 614 to create a robust interconnect between first interconnect portion 610 and second interconnect portion 620. In one embodiment, fusible coupling surface 624 is prepared by creating a photoresist having a top opening which is smaller than a bottom opening in the photoresist. By depositing an interconnect material through the resist opening and subsequent photoresist liftoff, a second interconnect portion 620 having a second conductive structure 625 coated with fusible coupling 624 is created. In another embodiment, second conductive structure 624 is prepared by a plating process in which a photoresist is created, the photoresist having a top opening which is larger than a bottom opening.

First interconnect portion 610 and second interconnect portion 620 may be coupled together through a coupling process (e.g., a reflow process) in which at least of portion of the second conductive structure 624 of second interconnect portion 620 is received in cavity 615 of the first conductive structure 614 of first interconnect portion 610. During the coupling process, the fusible coupling surface 626 on the second portion of second conductive structure 624 may, for example, melt and remain within the cavity 615 of first conductive structure 614 to form an electrical connection between second conductive structure 624 and first conductive structure 614. Such may provide for a finer pitch and robust interconnect. As one example, a top portion of cavity 615 may be provided having a larger surface than a bottom portion of second interconnect portion 620 (e.g., fusible coupling surface 626). Fusible coupling surface 626 may melt within the cavity 615 and stay within cavity 615. Thus, bonding of second interconnect portion 620 with first interconnect portion 610 will prevent solder spreading during reflow and/or melting and maintain a finer pitch interconnect.

In one embodiment, the size and shape of at least one of the interconnect pad 612, the first conductive structure 614, the cavity 615, the interconnect pad 622 and the second conductive structure 624 is selected to achieve a desired pitch (e.g., a pitch requirement of a semiconductor structure). For example, a 10-15 um thick photoresist having a top opening which is around 12-14 micron and bottom opening which is around 18-22 micron can create a second interconnect portion 620 with a thickness (i.e., a distance between first and second opposing portions) of about 10 micron or less. In embodiments including fusible coupling surface 626, second interconnect portion 620 may have a thickness which is less or equal to about 12-14 micron, for example. Similarly, a 10-15 um thick photoresist having a top opening which is around 18-22 micron and bottom opening which is around 12-14 micron can create a first interconnect portion 610 with a thickness of about 10 micron or less. In embodiment including cavity 615, first interconnect portion may have a thickness which is less or equal to about 18-22 micron. In the illustrated embodiment, first conductive structure 614 is provided having a substantially trapezoidal shape. However, it should be appreciated that the size and shape of first conductive structure 614 may be altered to achieve the desired pitch.

Several examples of creating an interconnect structure 600 by bonding second conductive structure 624 with first conductive structure 614 are described below. An about 4.5 um Sn bump (e.g., 624) and an about 4.5 um In bump (e.g., 614) will react with each other by applying heat with or without pressure to create a less than about 9 micron tin-indium interconnect. An about 8 um Sn bump (e.g., 624) and an about 1 um In bump/pad (e.g., 614) will react with each other by applying heat with or without pressure to create a less than about 9 micron tin-indium interface, InSn concentration gradient and Sn bump. An about 8 um In bump (e.g., 624) and an about 1 um Sn bump/pad (e.g., 614) will react with each other by applying heat with or without pressure to create a less than about 9 micron tin-indium interface, InSn concentration gradient and In bump. An about 8 um Pb bump (e.g., 624) and an about 1 um Sn bump/pad (e.g., 614) will react with each other by applying heat with or without pressure to create a less than about 9 micron SnPb interface, SnPb concentration gradient and Pb bump. An about 8 um Ag coated Sn bump (e.g., 624) and an about 1 um Cu bump/pad (e.g., 614) will react with each other by applying heat with or without pressure to create a less than about 9 micron Silver-tin-Cu interface and concentration gradient and Sn bump. An about Au coated 4.5 um Sn bump (e.g., 624) and an about Au coated 4.5 um In bump (e.g., 614) will react with each other by applying heat with or without pressure to create a less than about 9 micron tin-indium interface where Au diffuses within the tin-Indium matrix.

Figure 6A:
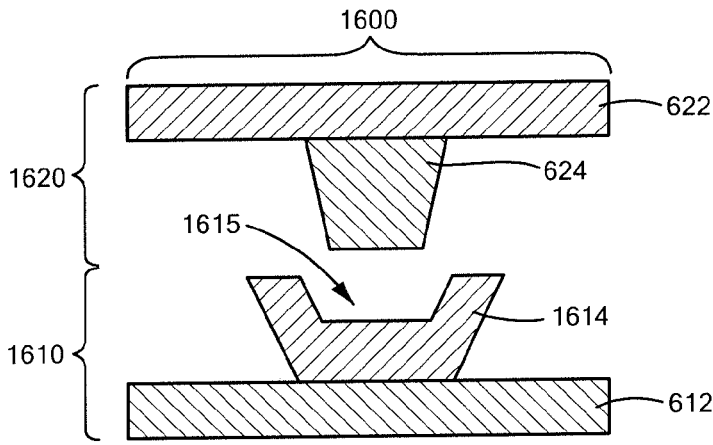

Referring now to FIG. 6A, in which like elements of FIG. 6 are provided having like reference designations, an example interconnect structure 1600 includes a first interconnect portion 1610 and a second interconnect portion 1620. First interconnect portion 1610 includes interconnect pad 612 and a first conductive structure (here, first conductive structure 1614). First conductive structure 1614, which is provided from one or more fusible conductive materials (e.g., solder melt materials) in the illustrated embodiment, has a cavity 1615 which may be the same as or similar to cavity 615 of first conductive structure 614 of FIG. 6. Second interconnect portion 1620 includes second conductive structure 624.

Similar to interconnect structure 600, first interconnect portion 1610 and second interconnect portion 1620 of interconnect structure 1600 may be coupled together through a coupling process in which at least of portion of the second conductive structure 624 of second interconnect portion 1620 is received in cavity 1615 of the first conductive structure 1614 of first interconnect portion 1610. During the coupling process, the second conductive structure 624 is coupled to select portions of cavity 1615 of first conductive structure 1614. In one embodiment, second conductive structure 624 is coupled to the select portions of cavity 1615 at a temperature which is less than the solder melt temperature of first conductive structure 1614.

In one embodiment, second conductive structure 624 can be a micro pillar which can bond with first conductive structure 1614 at temperature which is less than its solder melt temperature. Additionally, in one embodiment, second conductive structure 624 can be a microbump which includes a single or multiple Cu seed layers, or be plated with Cu, and a low melt metal and/or alloy layer can be provided within cavity 1615. In such embodiment, melt flow of the low melt metal and/or alloy will flow towards second conductive structure 624. The low melt metal and/or alloy (e.g. Sn) may, for example, react with Cu to create at least one high melt solid solution.

Further, in one embodiment, at least part of the low melt metal and/or alloy remains unreacted and can act as healing agent (e.g., for strengthening the interconnect). Additionally, in one embodiment, at least part of the Cu plated layer can be replace by other metals such Ag, Au, Ni and the like. It is also possible to use single and/or multiple low temperature melt layer which melts and forms a multiple high melt composition. It is further possible to use low temperature melt metals and/or alloys (e.g., Tin and Indium) which reacts with each other and creates a lower melt (e.g., 48 weight % Tin and 52 weight % Tin Indium) composition. It is further possible that a low melt composition reacts with metals within the composition as well as other metals present in first conductive structure 1614 to create a higher melt composition than that of individual metals (e.g., Tin and Indium). It is further possible to create a composition gradient as well as melt temperature gradient. It is further also to create a multi metal layer first conductive structure 1614 with at least one low temperature melt composition which melts and flows to repair opens and/or defects in the interconnect.

Figure 6B:
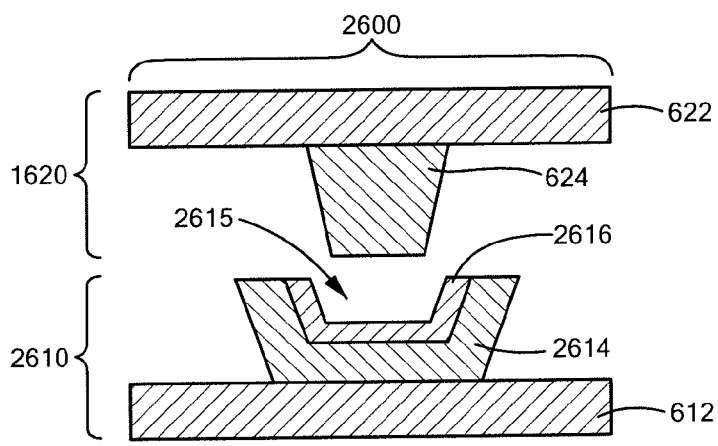

Referring now to FIG. 6B, another example interconnect structure 2600 as may be provided in a multi-layer semiconductor device fabricated using a combination of interconnect structures is shown. Interconnect structure 2600 includes a first interconnect portion 2610 and second interconnect portion 1620. Additionally, first interconnect portion 2610 includes interconnect pad 612 and a first conductive structure 2614 (e.g., a UBM structure provided from a metal or alloy material). First conductive structure 2614 has a first portion (here, a first surface) which is disposed over and coupled to the second surface of interconnect pad 612. Additionally, a second opposing portion (here, a second opposing surface) of first conductive structure 2614 is coated with a fusible conductive material (e.g., a solder melt material) to produce a fusible coupling surface 2616 on the second portion of first conductive structure 2614.

First conductive structure 2614 also has a cavity 2615 (e.g., a solder coated cavity) formed in the second portion of the first conductive structure 2614. First interconnect portion 2610 and second interconnect portion 1620 may be coupled together through a coupling process in which at least of portion of the second conductive structure 624 of second interconnect portion 1620 is received in the cavity 2615. During the coupling process, the second conductive structure 624 is coupled to select portions of the cavity 1615. In one embodiment, second conductive structure 624 is coupled to the select portions of the cavity 1615 at a temperature which is less than the solder melt temperature of the fusible coupling surface 2616.

Second conductive structure 624, or a top surface (e.g., a second portion) of second conductive structure 624 may have a solder wettable surface (e.g., Au or Cu). Similarly, first conductive structure 614 (FIG. 6) and first conductive structure 2614, or top surfaces (i.e., second portions) of first conductive structure 614 and first conductive structure 2614 may have a solder wettable surface (e.g., Au or Cu). Fusible coupling surface 2616 within cavity 2615, as will be discussed, may help to prevent solder spreading during reflow and or melting and maintain finer pitch structure during bonding of first interconnect portion 2610 and second interconnect portion 1620. In one embodiment, second conductive structure 624 includes multiple Cu—Sn, Cu—Sn—Au, Cu—Sn—Pb, or Cu—Sn—Pb—Au based micro-pillars grown on top of interconnect pad 622 (e.g., a Cu pad). These micro-pillars may form multiple interconnections between second conductive structure 624 and first conductive structure 2614. The interconnections (e.g., at a contact point of second conductive structure 624 and first conductive structure 2614) may create an interlock structure which can reduce the failure risk of a resistive open circuit.

Figure 7:
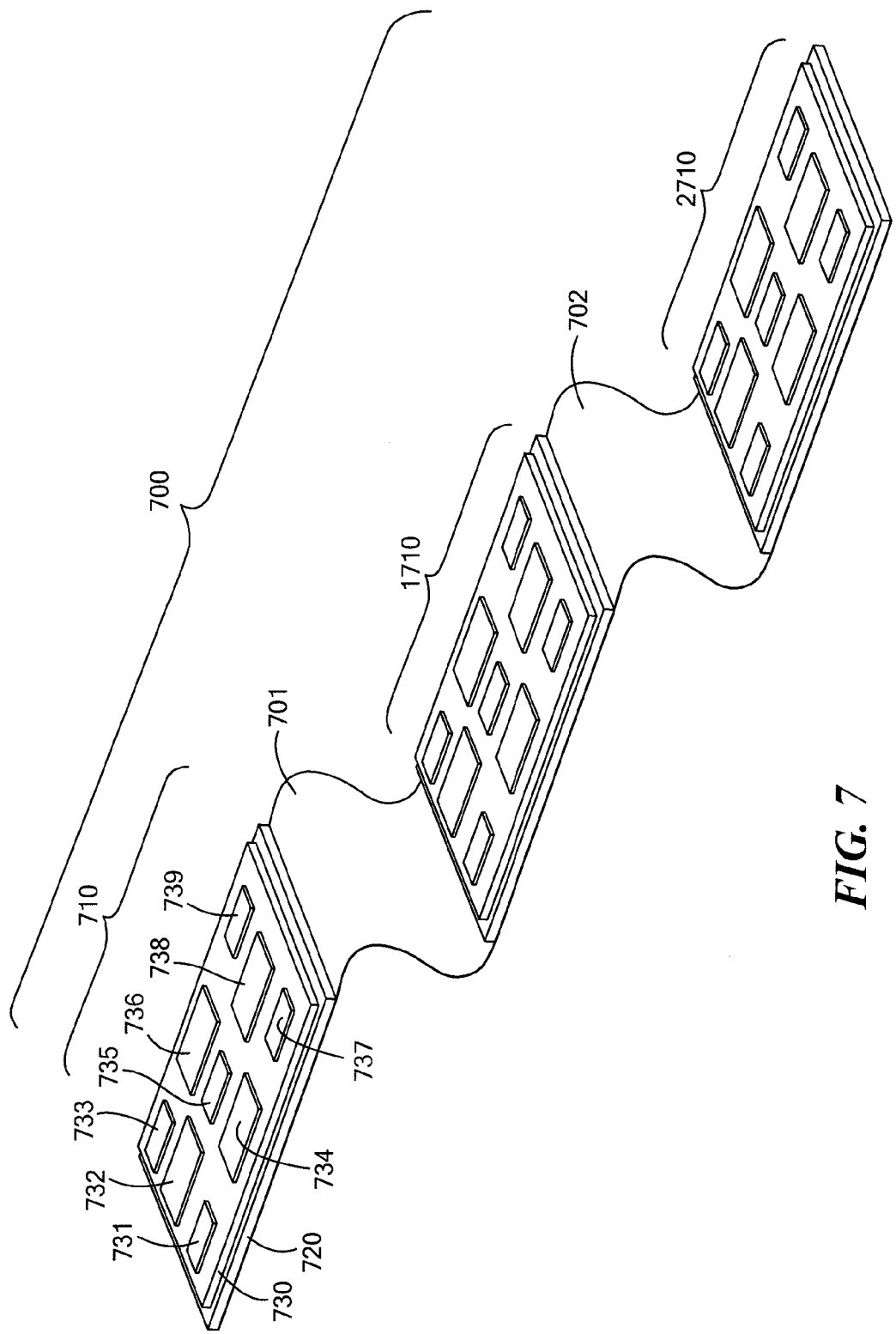
FIG. 7 is a block diagram of an example structure including a plurality of multi-layer semiconductor devices.

Referring now to FIG. 7, an example structure 700 including a plurality of multi-layer semiconductor devices (here, three multi-layer semiconductor devices) in accordance with the concepts, systems, circuits, and techniques sought to be protected herein is shown. Structure 700 includes a first multi-layer semiconductor device 710, a second multi-layer semiconductor device 1710 and a third multi-layer semiconductor device 2710, each of which may be the same as or similar to one or more of the multi-layer semiconductor devices (e.g., semiconductor device 100, FIG. 1) described in conjunction with the figures above. Structure 700 also includes a first flexible interconnect structure 701 (e.g., flex part of rigid-flex or detachable flex) for coupling semiconductor device 710 to semiconductor device 1710, and a second flexible interconnect structure 702 for coupling semiconductor device 1710 to semiconductor device 2710.

In one embodiment, flexible interconnect structure 701 and flexible interconnect structure 702 can be silicone based stretchable and/or silicone coated high density, miniaturized polyimide and/or liquid crystal polymer (LCP) based flexible circuits. Additionally, in one embodiment, flexible interconnect structure 701 and flexible interconnect structure 702 can be single or multi-layer flexible circuits provided from at least one of polycarbonate, poly(ether ether ketone), polyetherimide, fluorene polyester, and polyimide. Further, stretchable circuits and/or connectors can be created for flexible interconnect structure 701 and flexible interconnect structure 702 by appropriate laser profiling and/or laser removal of select portions of flexible interconnect structure 701 and flexible interconnect structure 702, and subsequent application of a silicone coating to flexible interconnect structure 701 and flexible interconnect structure 702.

Semiconductor device 710 is fabricated using a combination of interconnect structures (not shown) and includes semiconductor structure 720 (e.g., a PCB structure), semiconductor structure 730 (e.g., an MCM structure), and semiconductor structures 731-739 (e.g., 2D IC structures). Semiconductor structure 730 is disposed over and coupled to semiconductor structure 720 using one or more interconnect structures. Additionally, semiconductor structures 731-739 are disposed over and coupled to semiconductor structure 730 using a combination of interconnect structures. Semiconductor structures 731-739 may, for example, be provided having a plurality of package pitches and may be provided on a same package level of semiconductor device 710 through use of the combination of interconnect structures in accordance with the concepts, systems, circuits, and techniques sought to be protected herein. Semiconductor devices 1710 and 2710 may be the same as or similar to semiconductor device 710, for example.

Although semiconductor device 1710 is shown as only coupled with semiconductor device 2710 and semiconductor device 710 in the illustrated embodiment, in one embodiment semiconductor device 1710 (and semiconductor devices 710, 2710) can be further coupled with one or more additional semiconductor devices (e.g., which may be the same as semiconductor device 710 and semiconductor device 2710). Additionally, in one embodiment, semiconductor device 710 and semiconductor device 2710 can be further coupled with several other flex circuits to create different structures.

As described above and will be appreciated by one of skill in the art, embodiments of the disclosure herein may be configured as a system, method, or combination thereof. Accordingly, embodiments of the present disclosure may be comprised of various means including hardware, software, firmware or any combination thereof. Furthermore, embodiments of the present disclosure may take the form of a computer program product on a computer-readable storage medium having computer readable program instructions (e.g., computer software) embodied in the storage medium. Any suitable non-transitory computer-readable storage medium may be utilized.

It is to be appreciated that the concepts, systems, circuits and techniques sought to be protected herein are not limited to use in a particular application (e.g., filter circuitry in mobile phones, tablets, digital cameras and the like). In contrast, the concepts, systems, circuits and techniques sought to be protected herein may be found useful in substantially any application where a semiconductor manufacturer desires to fabricate semiconductor sections, structures and/or devices having a thinnest possible active area cross section in comparison to conventional semiconductor sections, structures and devices. The concepts, systems, circuits and techniques sought to be protected herein may be found useful in substantially any application where a semiconductor manufacturer desires to fabricate multi-layer semiconductor devices including semiconductor structures having different package pitches on a same package level of the multi-layer semiconductor devices.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

The invention claimed is:
1. A multi-layer semiconductor device comprising:
a first semiconductor structure having first and second opposing surfaces, the second surface of the first semiconductor structure having at least a first semiconductor package pitch;

a second semiconductor structure having first and second opposing surfaces, the first surface of the second semiconductor structure having a second semiconductor package pitch;

a third semiconductor structure having first and second opposing surfaces, the first surface of the third semiconductor structure having a third semiconductor package pitch which is different from at least the second semiconductor package pitch;

one or more first interconnect structures disposed between and coupled to first select portions of the first surface of the second semiconductor structure and to first select portions of the second surface of the first semiconductor structure to form an interconnect for electrically and mechanically coupling the second semiconductor structure to the first semiconductor structure, each of the first interconnect structures having first and second opposing portions, wherein a distance between the first and second portions is selected based upon at least one of the first semiconductor package pitch and the second semiconductor package pitch; and one or more second interconnect structures disposed between and coupled to first select portions of the first surface of the third semiconductor structure and to second select portions of the second surface of the first semiconductor structure to form an interconnect for electrically and mechanically coupling the third semiconductor structure to the first semiconductor structure, each of the second interconnect structures having first and second opposing portions, wherein a distance between the first and second portions is selected based upon at least one of the first semiconductor package pitch and the third semiconductor package pitch, and the first and second interconnect structures are selected such that second semiconductor structure is provided on a same package level of the multi-layer semiconductor device as the third semiconductor structure;

wherein at least one of the first interconnect structures comprises:

a first interconnect structure portion coupled to the second surface of first semiconductor structure, including:
 a first interconnect pad having first and second opposing surfaces, the first surface of the first interconnect pad corresponding to the first portion of the at least one of the first interconnect structures; and
 a first conductive structure having first and second opposing surfaces and one or more sides, the first surface disposed over and coupled to the second surface of the first interconnect pad, and the second surface and select ones of the sides coated with a first fusible conductive material having a first melt temperature; and a second interconnect structure portion coupled to the first surface of second semiconductor structure, including:
 a second interconnect pad having first and second opposing surfaces, the first surface of the first interconnect pad corresponding to the second portion of the at least one of the first interconnect structures; and
 a second conductive structure having first and second opposing surfaces and one or more sides, the first surface disposed over and coupled to the second surface of the second interconnect pad and wherein the second surface and select ones of the sides of the second conductive structure are coated with a second fusible conductive material having a second, different melt temperature; and an under bump metallization (UBM) layer or structure disposed between the first surface of the second conductive structure and the second surface of the second interconnect pad, the UBM layer or structure provided from a third fusible conductive material having a third, different melt temperature.

2. The multi-layer semiconductor device of claim 1 wherein the first semiconductor structure is an interposer module or a multi-chip module (MCM).

3. The multi-layer semiconductor device of claim 1 wherein at least one of the first interconnect structures comprises:

a first interconnect structure portion coupled to the second surface of first semiconductor structure, including:
 a first interconnect pad having first and second opposing surfaces, the first surface of the first interconnect pad corresponding to the first portion of the at least one of the first interconnect structures; and
 a first conductive structure having first and second opposing portions, the first portion disposed over and coupled to the second surface of the first interconnect pad, and the second portion having a cavity formed in select parts of the second portion; and a second interconnect structure portion coupled to the first surface of second semiconductor structure, including:
 a second interconnect pad having first and second opposing surfaces, the first surface of the first interconnect pad corresponding to the second portion of the at least one of the first interconnect structures; and
 a second conductive structure having first and second opposing portions, the first portion disposed over and coupled to the second surface of the second interconnect pad.

4. The multi-layer semiconductor device of claim 3 wherein the cavity has a predetermined shape and extends a predetermined distance between the second portion of the first conductive structure and the first portion of the first conductive structure.

5. The multi-layer semiconductor device of claim 4 wherein the predetermined shape is selected such that the cavity is shaped to receive at least a select part of the second portion of the second conductive structure during coupling.

6. The multi-layer semiconductor device of claim 3 wherein dimensions of one or more of the first interconnect pad, the first conductive structure, the cavity, the second interconnect pad and the second conductive structure are selected based upon at least one of the first semiconductor package pitch and the second semiconductor package pitch.

7. The multi-layer semiconductor device of claim 3 wherein at least one of the second portion of the second conductive structure and the cavity is coated with a fusible conductive material.

8. The multi-layer semiconductor device of claim 3 wherein the first conductive structure is provided from a material or combination of materials having a first melt temperature, and the second conductive structure is provided from a material or combination of materials having a second, different melt temperature.

9. The multi-layer semiconductor device of claim 3 wherein the second conductive structure is provided as a solder ball, sphere, pillar, or micro-bump.

10. The multi-layer semiconductor device of claim 1 wherein at least one of the second interconnect structures comprises:

a first interconnect pad coupled to the second surface of the first semiconductor structure or to the first surface of the third semiconductor structure, the first interconnect pad having first and second opposing surfaces, the first surface corresponding to the first portion of the at least one of the second interconnect structures;
a first conductive structure having first and second opposing portions and one or more edges spaced between the first and second portions, the first portion disposed over and coupled to first select portions of the second surface of the first interconnect pad, and the second portion corresponding to the second portion of the at least one of the second interconnect structures; and
a first barrier structure having first and second opposing surfaces and one or more sides, the first surface disposed over and coupled to second select portions of the second surface of the interconnect pad, and surrounding corresponding edges of the first conductive structure.

11. The multi-layer semiconductor device of claim 10 wherein the second portion of the first conductive structure extends a predetermined distance above the second surface of the first interconnect connect pad, the predetermined distance selected based upon at least one of the first semiconductor package pitch and the third semiconductor package pitch.

12. The multi-layer semiconductor device of claim 10 wherein the first conductive structure is provided from a material having a first surface energy and the first barrier structure is provided from a material having a second, lower surface energy.

13. The multi-layer semiconductor device of claim 1 wherein the first interconnect structures comprise:
at least one interconnect structure provided as an Indium (In) micro-bump; and
at least one interconnect structure provided as a Gold (Au) micro-bump.

14. The multi-layer semiconductor device of claim 13 wherein the second semiconductor structure is coupled to the first semiconductor structure using a flip-chip bonding process, and the at least one interconnect structure provided as a Gold (Au) micro-bump controls the distance between the first and second portions of the at least one interconnect structure provided as an Indium (In) micro-bump during the flip-chip bonding process.

15. The multi-layer semiconductor device of claim 1 further comprising:
a fourth semiconductor structure having first and second opposing surfaces, the first surface of fourth semiconductor structure having a fourth semiconductor package pitch which is different from at least one of the second semiconductor package pitch and the third semiconductor package pitch; and
one or more third interconnect structures disposed between and coupled to first select portions of the first surface of the third semiconductor structure and to third select portions of the second surface of the first semiconductor structure to form an interconnect for electrically and mechanically coupling the fourth semiconductor structure to the first semiconductor structure, each of the third interconnect structures having first and second opposing portions, wherein a distance between the first and second portions is selected based upon at least one of the first semiconductor package pitch and the fourth semiconductor package pitch, and the third interconnect structures are selected such that fourth semiconductor structure is provided on a same package level of the multi-layer semiconductor device as each of the second and third semiconductor structures.

* * * * *